(12) United States Patent
Cha et al.

(10) Patent No.: US 10,916,617 B2
(45) Date of Patent: Feb. 9, 2021

(54) DISPLAY DEVICE

(71) Applicant: SAMSUNG DISPLAY CO., LTD., Yongin-si (KR)

(72) Inventors: Myounggeun Cha, Seoul (KR); Sanggun Choi, Suwon-si (KR); Jiyeong Shin, Busan (KR); Yong Su Lee, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/382,634

(22) Filed: Apr. 12, 2019

(65) Prior Publication Data

US 2019/0341440 A1   Nov. 7, 2019

(30) Foreign Application Priority Data

May 4, 2018 (KR) .................. 10-2018-0052162

(51) Int. Cl.
| | |
|---|---|
| H01L 29/08 | (2006.01) |
| H01L 27/32 | (2006.01) |
| G09G 3/3233 | (2016.01) |
| G09G 3/3266 | (2016.01) |
| G09G 3/3291 | (2016.01) |
| H01L 33/06 | (2010.01) |

(Continued)

(52) U.S. Cl.
CPC ....... *H01L 27/3276* (2013.01); *G09G 3/3233* (2013.01); *G09G 3/3266* (2013.01); *G09G 3/3291* (2013.01); *H01L 27/156* (2013.01); *H01L 27/322* (2013.01); *H01L 27/3262* (2013.01); *H01L 33/06* (2013.01); *H01L 33/50* (2013.01); *G09G 2300/0426* (2013.01); *H01L 2227/323* (2013.01)

(58) Field of Classification Search
CPC . H01L 27/322; H01L 27/155; H01L 27/3276; G09G 3/3233; G09G 3/3266; G09G 3/3291

See application file for complete search history.

(56) References Cited

U.S. PATENT DOCUMENTS 9,530,800 B2   12/2016   Wang et al.
10,140,039 B1   11/2018   Baruch et al.
(Continued)

FOREIGN PATENT DOCUMENTS

KR   10-2012-0007764   1/2012
KR   10-2014-0039617   4/2014
(Continued)

*Primary Examiner* — Phuc T Dang
(74) *Attorney, Agent, or Firm* — F. Chau & Associates, LLC

(57) ABSTRACT

A display device including: a substrate; a light emitting element on the substrate; a pixel circuit between the substrate and the light emitting element, wherein the pixel circuit is electrically connected to the light emitting element, and includes a plurality of transistors; and a conductive pattern including an electrode portion and a wiring portion for supplying a voltage to the electrode portion, wherein the electrode portion overlaps an active pattern of at least one transistor among the plurality of transistors, wherein the conductive pattern is disposed between the substrate and the active pattern, and wherein a thickness of the wiring portion is greater than a thickness of the electrode portion.

18 Claims, 21 Drawing Sheets

(51) Int. Cl.
*H01L 33/50* (2010.01)
*H01L 27/15* (2006.01)

(56) References Cited

U.S. PATENT DOCUMENTS

2017/0317104 A1* 11/2017 Jeong .................... H01L 27/124
2018/0012549 A1*  1/2018 Lee ..................... H01L 27/3276
2018/0284927 A1* 10/2018 Kim ..................... H01L 27/3276
2019/0165071 A1*  5/2019 Maruyama .......... H01L 27/1225

FOREIGN PATENT DOCUMENTS

| KR | 10-2016-0055648 | 5/2016 |
| KR | 10-2017-0049705 | 5/2017 |
| KR | 10-2017-0076184 | 7/2017 |

* cited by examiner

DISPLAY DEVICE

CROSS-REFERENCE TO RELATED APPLICATION(S)

This application claims priority under 35 U.S.C. § 119 to Korean Patent Application No. 10-2018-0052162, filed on May 4, 2018 in the Korean Intellectual Property Office (KIPO), the disclosure of which is incorporated by reference herein in its entirety.

1. Technical Field

The present inventive concept relates to a display device. More particularly, the present inventive concept relates to a display device including transistors and a method of manufacturing the display device.

2. Description of the Related Art

A flat panel display device is a television, monitor or other display apparatus, such as a smartphone, that uses a thin panel design. Flat panel display devices are broadly used. Among the flat panel display devices, an organic light emitting display (OLED) device works without a backlight because it emits visible light. The OLED device has advantageous characteristics, such as slim thickness, light weight, low power consumption, fast response speed, and the like.

The display device may include a plurality of thin film transistors and a light emitting element connected to the thin film transistors. The light emitting element may emit light having a luminance corresponding to a voltage supplied to the light emitting element through the thin film transistors.

SUMMARY

A display device according to an exemplary embodiment of the present inventive concept may include a substrate; a light emitting element on the substrate; a pixel circuit between the substrate and the light emitting element, wherein the pixel circuit is electrically connected to the light emitting element, and includes a plurality of transistors; and a conductive pattern including an electrode portion and a wiring portion for supplying a voltage to the electrode portion, wherein the electrode portion overlaps an active pattern of at least one transistor among the plurality of transistors, wherein the conductive pattern is disposed between the substrate and the active pattern, and wherein a thickness of the wiring portion is greater than a thickness of the electrode portion.

In an exemplary embodiment of the present inventive concept, the thickness of the electrode portion may be in a range from about 500 angstrom (Å) to about 1000 Å, and the thickness of the wiring portion may be in a range from about 2000 Å to about 3000 Å.

In an exemplary embodiment of the present inventive concept, the conductive pattern may include a first conductive layer formed in the electrode portion and the wiring portion, and a second conductive layer on the first conductive layer and formed in the wiring portion.

In an exemplary embodiment of the present inventive concept, a thickness of the first conductive layer may be in a range from about 500 Å to about 1000 Å, and a thickness of the second conductive layer may be in a range from about 1500 Å to about 2000 Å.

In an exemplary embodiment of the present inventive concept, a width of the wiring portion may be less than a width of the electrode portion.

In an exemplary embodiment of the present inventive concept, the plurality of transistors may include a first transistor including a first active pattern on the substrate and a first gate electrode on the first active pattern, the first active pattern including a first channel. The electrode portion may overlap the first channel.

In an exemplary embodiment of the present inventive concept, the plurality of transistors may further include a second transistor including a second active pattern connected to the first active pattern and a second gate electrode on the second active pattern, and a third transistor including a third active pattern, and a third gate electrode on the third active pattern, the third active pattern including a third channel. The third active pattern may be connected to the first active pattern and the first gate electrode. The electrode portion may overlap the third channel.

In an exemplary embodiment of the present inventive concept, the electrode portion may not overlap the second active pattern.

In an exemplary embodiment of the present inventive concept the plurality of transistors may further include a fourth transistor including a fourth active pattern, and a fourth gate electrode on the fourth active pattern, the fourth active pattern including a fourth channel. The fourth active pattern may be connected to the first gate electrode and the third gate electrode. The electrode portion may overlap the fourth channel.

In an exemplary embodiment of the present inventive concept, the electrode portion may include a first electrode portion overlapping the active pattern of the at least one transistor among the plurality of transistors, and a second electrode portion spaced apart from the first electrode portion and overlapping an active pattern of another transistor among the plurality of transistors. The wiring portion may connect the second electrode portion to the first electrode portion.

A display device according to an exemplary embodiment of the present inventive concept may include a substrate, a plurality of light emitting elements on the substrate, a plurality of transistors between the substrate and the plurality of light emitting elements, and electrically connected to the plurality of light emitting elements, and a conductive pattern including a plurality of electrode portions overlapping an active pattern included in each of the plurality of transistors and a plurality of wiring portions connecting the plurality of electrode portions. A thickness of each of the wiring portions may be greater than a thickness of each of the electrode portions.

In an exemplary embodiment of the present inventive concept, the conductive pattern may have a grid shape in a plan view.

A method of manufacturing a display device according to an exemplary embodiment of the present inventive concept may include forming a conductive pattern including an electrode portion and a wiring portion for supplying a voltage to the electrode portion on a substrate, forming a transistor including an active pattern, wherein the active pattern overlaps the electrode portion of the conductive pattern, and forming a light emitting element electrically connected to the transistor, wherein the light emitting element overlaps the transistor. A thickness of the wiring portion may be greater than a thickness of the electrode portion.

In an exemplary embodiment of the present inventive concept, the conductive pattern may include a first conductive layer formed in the electrode portion and the wiring portion and a second conductive layer on the first conductive layer and formed in the wiring portion.

In an exemplary embodiment of the present inventive concept, forming the conductive pattern may include sequentially forming a first preliminary conductive layer and a second preliminary conductive layer on the substrate, forming the first conductive layer by partially etching the first and second preliminary conductive layers, and forming the second conductive layer by partially etching the second preliminary conductive layer.

In an exemplary embodiment of the present inventive concept, forming the conductive pattern may further include forming a photoresist pattern having a first thickness at a portion corresponding to the electrode portion and a second thickness greater than the first thickness at a portion corresponding to the wiring portion on the second preliminary conductive layer after forming the first and second preliminary conductive layers and before forming the first conductive layer.

In an exemplary embodiment of the present inventive concept, the photoresist pattern may be formed by a halftone mask or a slit mask.

In an exemplary embodiment of the present inventive concept, forming the first conductive layer may further include etching the first and second preliminary conductive layers by using the photoresist pattern as an etch-stopper.

In an exemplary embodiment of the present inventive concept, forming the second conductive layer may further include removing the photoresist pattern by at least the first thickness by using an etch-back process and etching the second preliminary conductive layer by using the photoresist pattern as an etch-stopper.

A display device may include: a substrate; a first light emitting element on the substrate; a first pixel circuit between the substrate and the first light emitting element, wherein the pixel circuit is electrically connected to the first light emitting element, and includes a first transistor and a second transistor; and a conductive pattern including a first portion and a second portion disposed on the first portion, wherein the first portion overlaps a first active pattern of the first transistor and a second active pattern of the second transistor, wherein the second portion does not overlap the first transistor and the second transistor, and wherein a thickness of the second portion is greater than a thickness of the first portion.

In an exemplary embodiment of the present inventive concept, the conductive pattern may include: a first conductive layer overlapped with the first transistor and the second transistor, and a second conductive layer disposed on the first conductive layer and not overlapped with the first transistor and the second transistor.

In an exemplary embodiment of the present inventive concept, the second conductive layer may be disposed in the second portion of the conductive pattern, and the first conductive layer may be disposed in the first portion of the conductive pattern.

In an exemplary embodiment of the present inventive concept, the display device may include a second light emitting element on the substrate; and a second pixel circuit between the substrate and the second light emitting element, wherein the second portion of the conductive pattern is disposed between the first pixel circuit and the second pixel circuit in a plan view.

BRIEF DESCRIPTION OF THE DRAWINGS

The above and other features of the present inventive concept will be more clearly understood by describing in detail exemplary embodiments thereof in conjunction with the accompanying drawings. In the drawings, like reference numerals may refer to like elements.

DETAILED DESCRIPTION OF THE EMBODIMENTS

Hereinafter, display devices and methods of manufacturing display devices in accordance with exemplary embodiments of the present inventive concept will be explained in detail with reference to the accompanying drawings.

Hereinafter, a display device according to an exemplary embodiment of the present inventive concept will be described with reference to FIGS. 1 to 6B.

Figure 1:
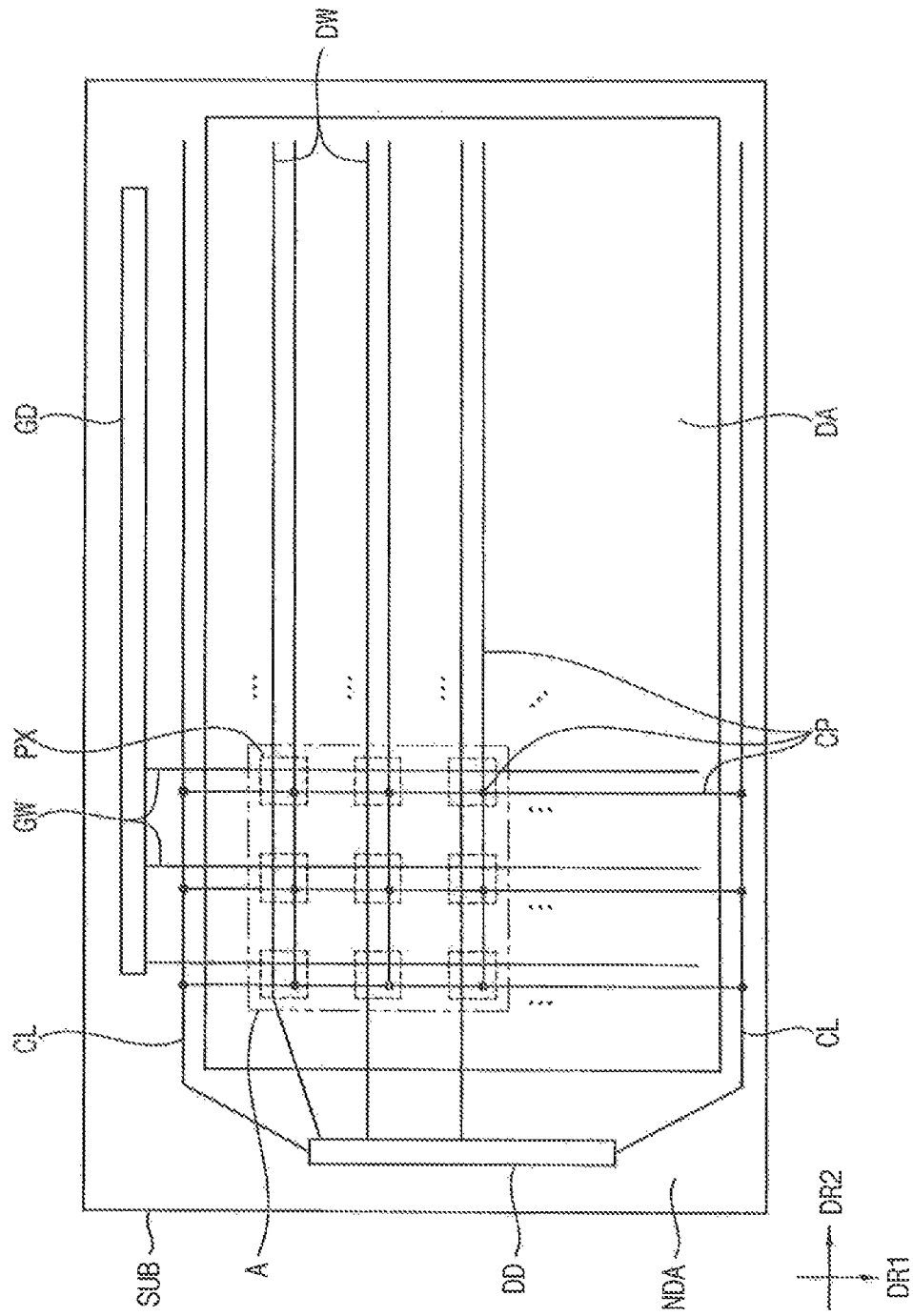
FIG. 1 is a plan view illustrating a display device according to an exemplary embodiment of the present inventive concept.

FIG. 1 is a plan view illustrating a display device according to an exemplary embodiment of the present inventive concept. Hereinafter, a pixel may be a minimum unit for displaying an image.

Referring to FIG. 1, a display device according to an exemplary embodiment of the present inventive concept may include a substrate SUB, a plurality of pixels PX, a plurality of gate wirings GW, a gate driver GD, a plurality of data wirings DW, a data driver DD, a connection line CL, and a conductive pattern CP.

The substrate SUB may include a display area DA and a non-display area NDA neighboring the display area DA. For example, the non-display area NDA may surround an edge of the display area DA.

The pixels PX may be located on the substrate SUB in the display area DA. The pixels PX may be connected to the gate wirings GW and the data wirings DW, respectively. Each of the pixels PX may include a light emitting element and a pixel circuit. The light emitting element may emit light depending on a driving current corresponding to a signal supplied from the data wirings DW. The data wiring DW that provides the signal is switched by a corresponding one of the gate wirings GW. The pixel circuit may include a plurality of thin film transistors and one or more capacitors for controlling the driving current through the light emitting element. Accordingly, a plurality of light emitting elements and a plurality of pixel circuits may be located on the substrate SUB in the display area DA. Each of the pixel circuits may include a plurality of thin film transistors connected to the light emitting element of the pixel circuit. Each of the pixel circuits may be located between the substrate SUB and its light emitting element.

Each of the gate wirings GW may be connected to the gate driver GD, and may extend along a first direction DR1. The gate wirings GW may be connected to the pixels PX, respectively. Each of the gate wirings GW may include a first scan line, a second scan line, a third scan line, an initialization voltage line, and an emission control line. The first scan line, the second scan line, the third scan line, the initialization voltage line, and the emission control line will be described below.

The gate wirings GW including the first scan line, the second scan line, the third scan line, the initialization voltage line, and the emission control line may be connected to another driver through pads on the substrate SUB without being connected to the gate driver GD. The gate driver GD may be located on the substrate SUB in the non-display area NDA, and may be connected to the gate wirings GW.

Each of the data wirings DW may be connected to the data driver DD, and may extend along a second direction DR2 crossing the first direction DR1. The data wirings DW may be connected to the pixels PX, respectively. Each of the data wirings DW may include a data line and a driving voltage line. The data line and the driving voltage line will be described below.

The data wirings DW including the data line and the driving voltage line may be connected to another driver through pads on the substrate SUB without being connected to the data driver DD. The data driver DD may be located on the substrate SUB in the non-display area NDA, and may be connected to the data wirings DW.

The connection line CL may be located on the substrate SUB in the non-display area NDA, and may be connected to the data driver DD. The connection line CL may be connected to the conductive pattern CP, and may connect the conductive pattern CF to the data driver DD. The connection line CL may be connected to another driver through pads on the substrate SUB without being connected to the data driver DD.

The conductive pattern CP may be electrically connected to the data driver DD through the connection line CL. Voltage may be supplied to the conductive pattern CP from the data driver DD or another driver. The voltage supplied to the conductive pattern CP may be the same as a voltage supplied to the driving voltage line included in the data wirings DW. However, the present inventive concept is not limited thereto, and a voltage different from the voltage supplied to the driving voltage line may be supplied to the conductive pattern CP.

Figure 2:
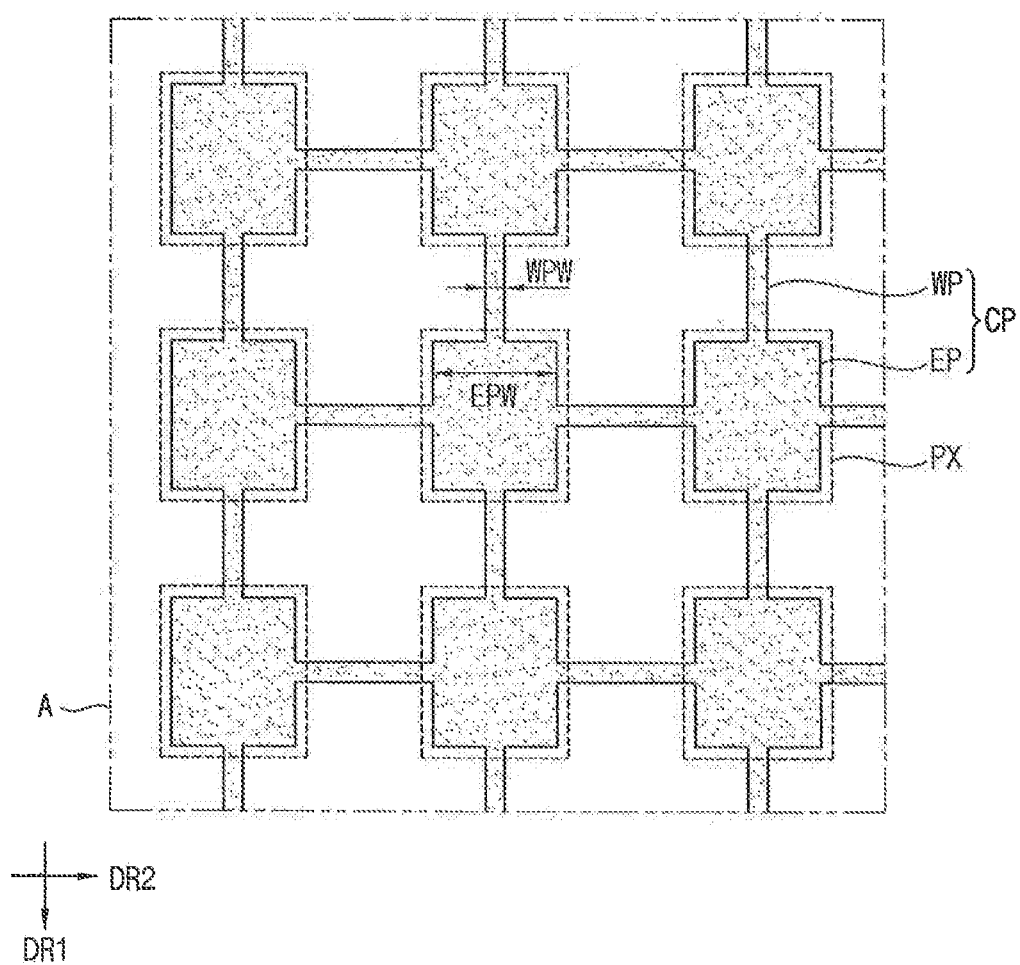
FIG. 2 is a plan view illustrating an area A in the display device in FIG. 1, according to an exemplary embodiment of the present inventive concept.

FIG. 2 is a plan view illustrating an area A in the display device in FIG. 1, according to an exemplary embodiment of the present inventive concept. In FIG. 2, the conductive pattern CP is roughly illustrated.

Referring to FIGS. 1 and 2, the conductive pattern CP may include a plurality of electrode portions EP and a plurality of wiring portions WP for supplying a voltage to the electrode portions EP.

Each of the electrode portions EP may be located to correspond to each of the pixels PX. For example, a first electrode portion EP may overlap an active pattern of some of the plurality of transistors of a first pixel circuit included in a first pixel PX.

The wiring portions WP may electrically connect the electrode portions EP to each other. The wiring portions WP may be located between the pixels PX, and may connect adjacent electrode portions EP to each other. Some wiring portions WP adjacent to the connection line CL may be electrically connected to the data driver DD through the connection line CL. A voltage may be supplied to the wiring portions WP, which are adjacent to the connection line CL, from the data driver DD, and these wiring portions WP may transmit the voltage to the electrode portions EP.

The conductive pattern CP may have a grid shape in a plan view. The conductive portions EP may be connected by the wiring portions WP, and may extend along the first direction DR1 and the second direction DR2. For example, one electrode portion EP may be connected to four electrode portions EP through four wiring portions WP.

A width WPW of each of the wiring portions WP may be less than a width EPW of each of the electrode portions EP. For example, a width WPW of each of the wiring portions WP in the first direction DR1 may be less than a width EPW of each of the electrode portions EP in the first direction DR1. In addition, a width WPW of each of the wiring portions WP in the second direction DR2 may be less than a width EPW of each of the electrode portions EP in the second direction DR2.

Hereinafter, a circuit of one pixel PX of the display device according to an exemplary embodiment of the present inventive concept will be described with reference FIG. 3.

Figure 3:
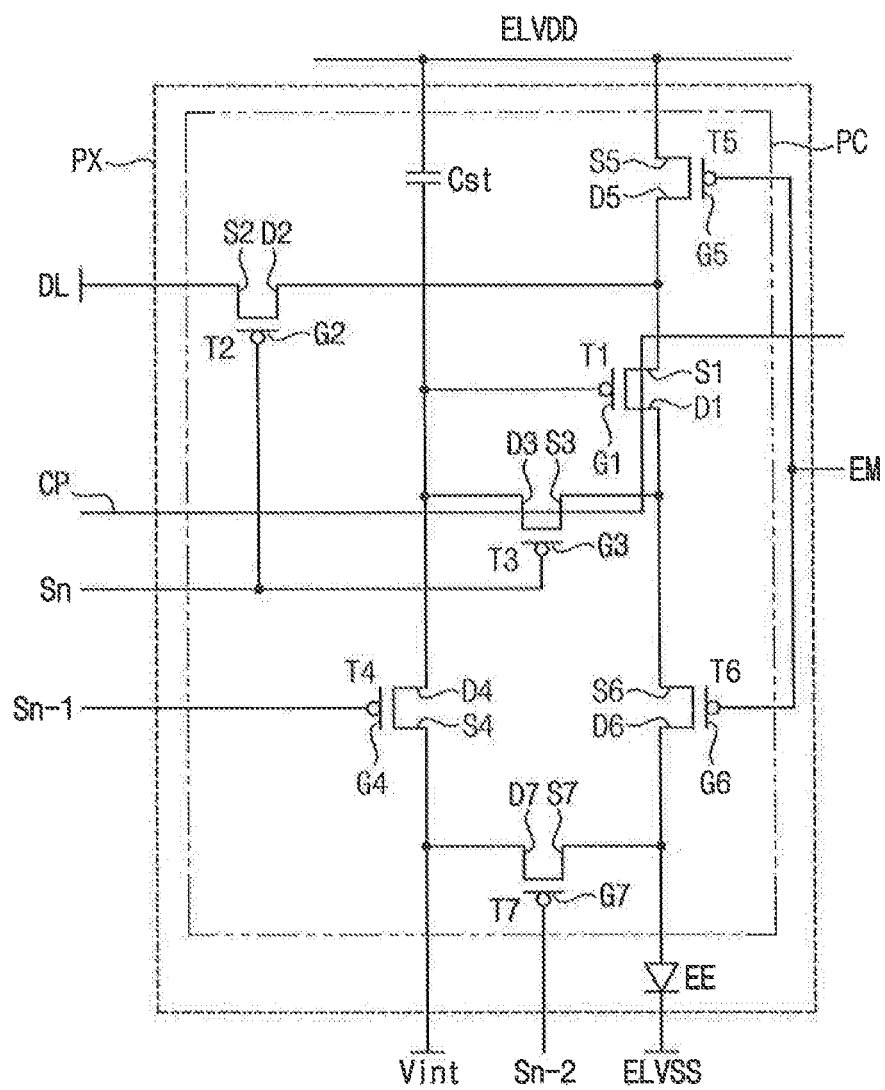
FIG. 3 is a circuit diagram illustrating a pixel of a display device according to an exemplary embodiment of the present inventive concept.

FIG. 3 is a circuit diagram illustrating a pixel of a display device according to an exemplary embodiment of the present inventive concept. For example, FIG. 3 may illustrate an example of one pixel of the display device in FIG. 1.

Referring to FIG. 3, a pixel PX of a display device according to an exemplary embodiment of the present inventive concept may include a pixel circuit PC and a light emitting element EE connected to the pixel circuit PC. The pixel circuit PC may include a plurality of thin film transistors T1, T2, T3, T4, T5, T6, and T7 and a capacitor Cst. The thin film transistors T1, T2, T3, T4, T5, T6, and T7 may be selectively connected to a first scan line Sn, a second scan line Sn-1, a third scan line Sn-2, an emission control line EM, an initialization voltage line Vint, a data line DL, and a driving voltage line ELVDD.

The above-described conductive pattern CP may pass through first and third thin film transistors T1 and T3 among the thin film transistors T1, T2, T3, T4, T5, T6, and T7 included in pixel circuit PC. The conductive pattern CP may overlap an active pattern of the first and third thin film transistors T1 and T3.

Here, the first scan line Sn, the second scan line Sn-1, the third scan line Sn-2, the emission control line EM, and the initialization voltage line Vint may be included in the above-described gate wirings GW, and the data line DL and the driving voltage line ELVDD may be included in the above-described data wirings DW. The first scan line Sn, the second scan line Sn-1 the third scan line Sn-2, the emission control line EM, the initialization voltage line Vint, the data line DL, and the driving voltage line ELVDD may include the same material or different materials, and may be provided on the same layer or different layers on the substrate SUB.

The thin film transistors T1, T2, T3, T4, T5, T6, and T7 may include the first thin film transistor T1, a second thin film transistor T2, the third thin film transistor T3, a fourth thin film transistor T4, a fifth thin film transistor T5, a sixth thin film transistor T6, and a seventh thin film transistor T7.

The first thin film transistor T1 may include: a first gate electrode G1 connected to a third drain electrode D3 of the third thin film transistor T3, a fourth drain electrode D4 of the fourth thin film transistor T4, and a first electrode of the capacitor Cst; a first source electrode S1 connected to a second drain electrode D2 of the second thin film transistor T2 and a fifth drain electrode D5 of the fifth thin film transistor T5; and a first drain electrode D1 connected to a third source electrode S3 of the third thin film transistor T3 and a sixth source electrode S6 of the sixth thin film transistor T6. The conductive pattern CP may pass through the first thin film transistor T1. For example, the conductive pattern CP may traverse the pixel circuit PC, and may overlap the active pattern of the first thin film transistor T1.

The second thin film transistor T2 may include a second gate electrode G2 connected to the first scan line Sn, a second source electrode S2 connected to the data line DL, and a second drain electrode D2 connected to the first source electrode S1 of the first thin film transistor T1.

The third thin film transistor T3 may include a third gate electrode G3 connected to the first scan line Sn, a third source electrode S3 connected to the first drain electrode D1 of the first thin film transistor T1, and a third drain electrode D3 connected to the first gate electrode G1 of the first thin film transistor T1. The conductive pattern CP may pass through the third thin film transistor T3. For example, the conductive pattern CP may traverse the pixel circuit PC, and may overlap the active pattern of the third thin film transistor T3.

The fourth thin film transistor T4 may include a fourth gate electrode G4 connected to the second scan line Sn-1, a fourth source electrode S4 connected to the initialization voltage line Vint, and a fourth drain electrode D4 connected to the first gate electrode G1 of the first thin film transistor T1.

The fifth thin film transistor T5 may include a fifth gate electrode G5 connected to the emission control line EM, a fifth source electrode S5 connected to the driving voltage line ELVDD, and a fifth drain electrode D5 connected to the first source electrode S1 of the first thin film transistor T1.

The sixth thin film transistor T6 may include a sixth gate electrode G6 connected to the emission control line EM, a sixth source electrode S6 connected to the first drain electrode D1 of the first thin film transistor T1, and a sixth drain electrode D6 connected to the light emitting element EE. The first thin film transistor T1 may be connected to the light emitting element EE through the sixth thin film transistor T6.

The seventh thin film transistor T7 may include a seventh gate electrode G7 connected to the third scan line Sn-2, a seventh source electrode S7 connected to the light emitting element EE, and a seventh drain electrode D7 connected to the fourth source electrode S4 of the fourth thin film transistor T4.

The capacitor Cst may include the first electrode connected to the first gate electrode G1 of the first thin film transistor T1 and the third drain electrode D3 of the third thin film transistor T3, and a second electrode connected to the driving voltage line ELVDD.

The light emitting element EE may include a first electrode, a second electrode located on the first electrode, and an emission layer located between the first electrode and the second electrode. The first electrode of the light emitting element EE may be an anode electrode and the second electrode of the light emitting element EE may be a cathode electrode. The first electrode of the light emitting element EE may be connected to the seventh source electrode S7 of the seventh thin film transistor T7 and the sixth drain electrode D6 of the sixth thin film transistor T6, and the second electrode of the light emitting element EE may be connected to a common power voltage ELVSS for supplying a common voltage.

Hereinafter, an arrangement of a pixel of the display device according to an exemplary embodiment of the present inventive concept will be described with reference to FIGS. 4 to 6B.

Insulation layers may be located between constituent elements located on different layers, and the insulation layers may be inorganic insulation layers including silicon nitride or silicon oxide, etc. or organic insulation layers. The insulation layers may be provided as a single layer or multiple layers.

Figure 4:
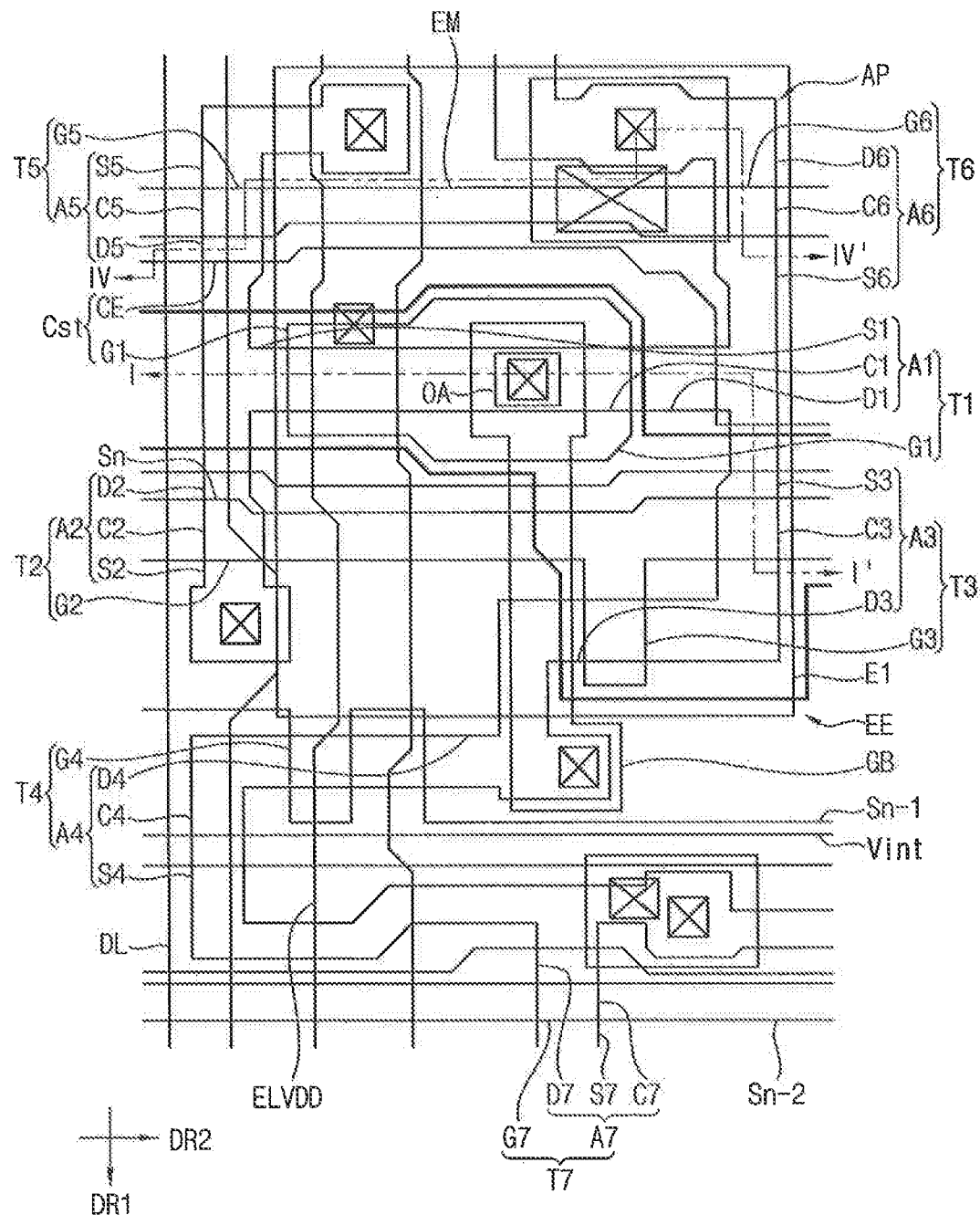
FIG. 4 is a layout view illustrating the pixel in FIG. 3, according to an exemplary embodiment of the present inventive concept.
Figure 5:
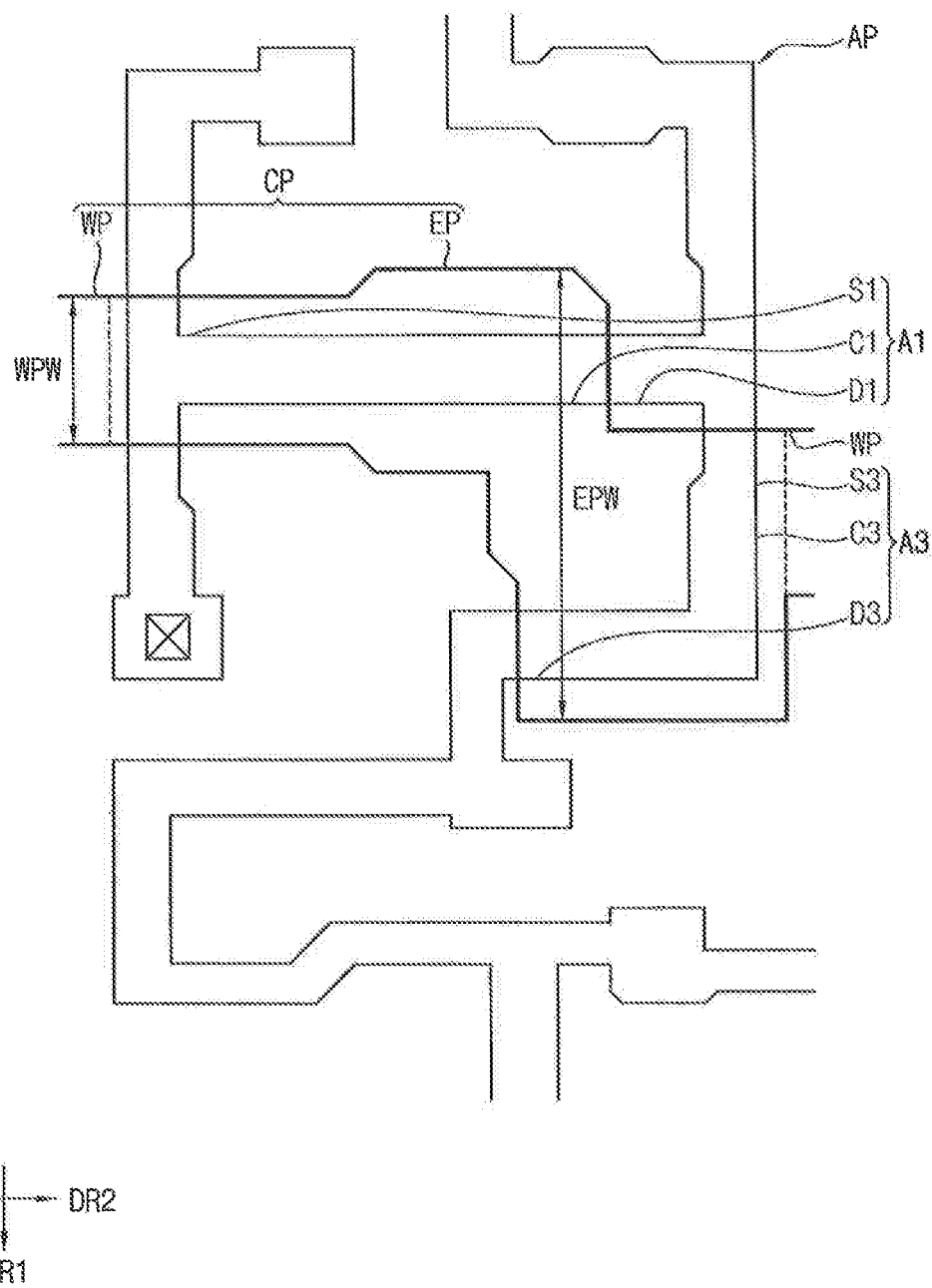
FIG. 5 is a layout view illustrating a conductive pattern and an active pattern of the pixel in FIG. 4, according to an exemplary embodiment of the present inventive concept.
Figure 6A:
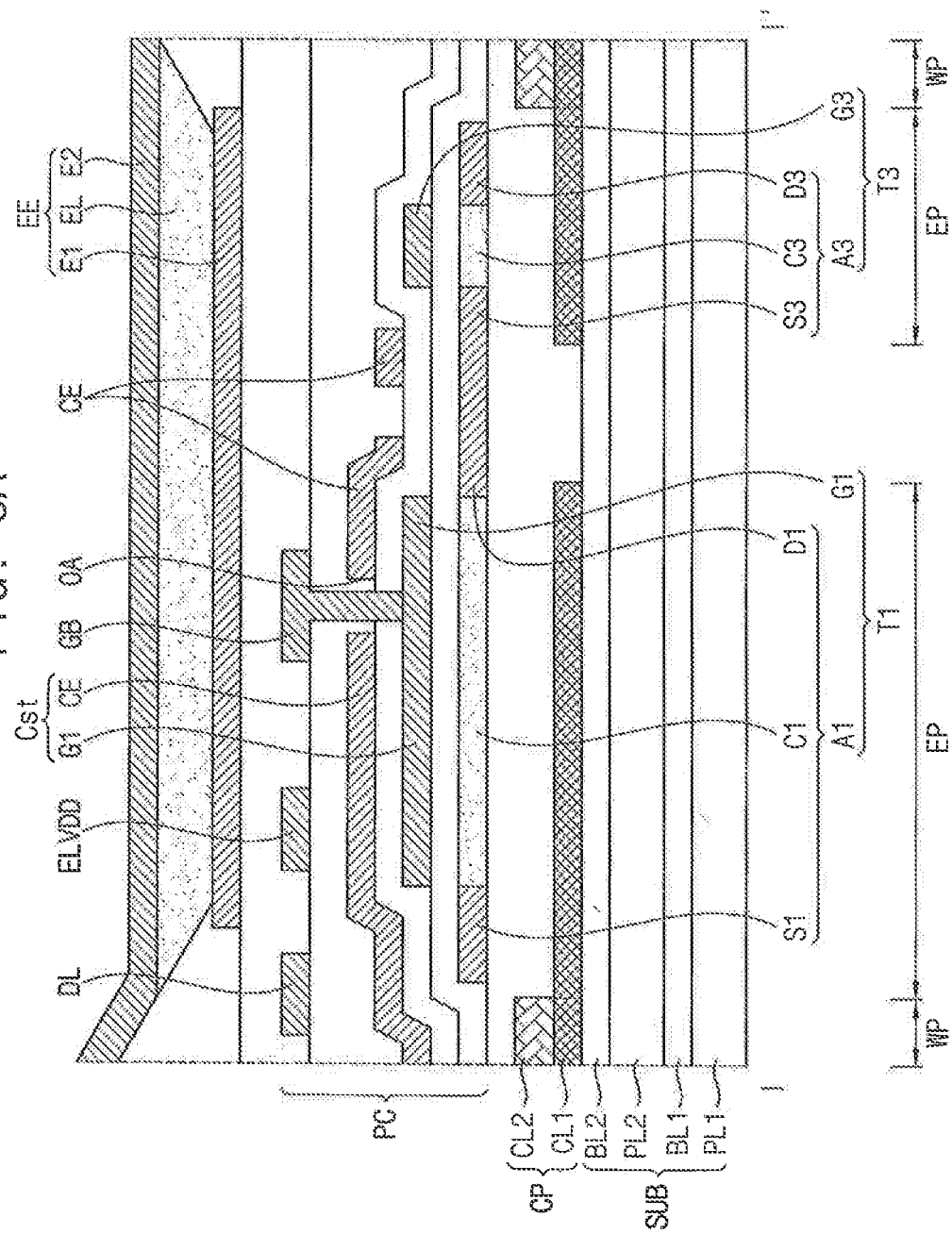
FIGS. 6A and 6B are cross-sectional views illustrating the display device in FIG. 4 taken along a line I-I' and a line IV-IV', according to an exemplary embodiment of the present inventive concept.
Figure 6B:
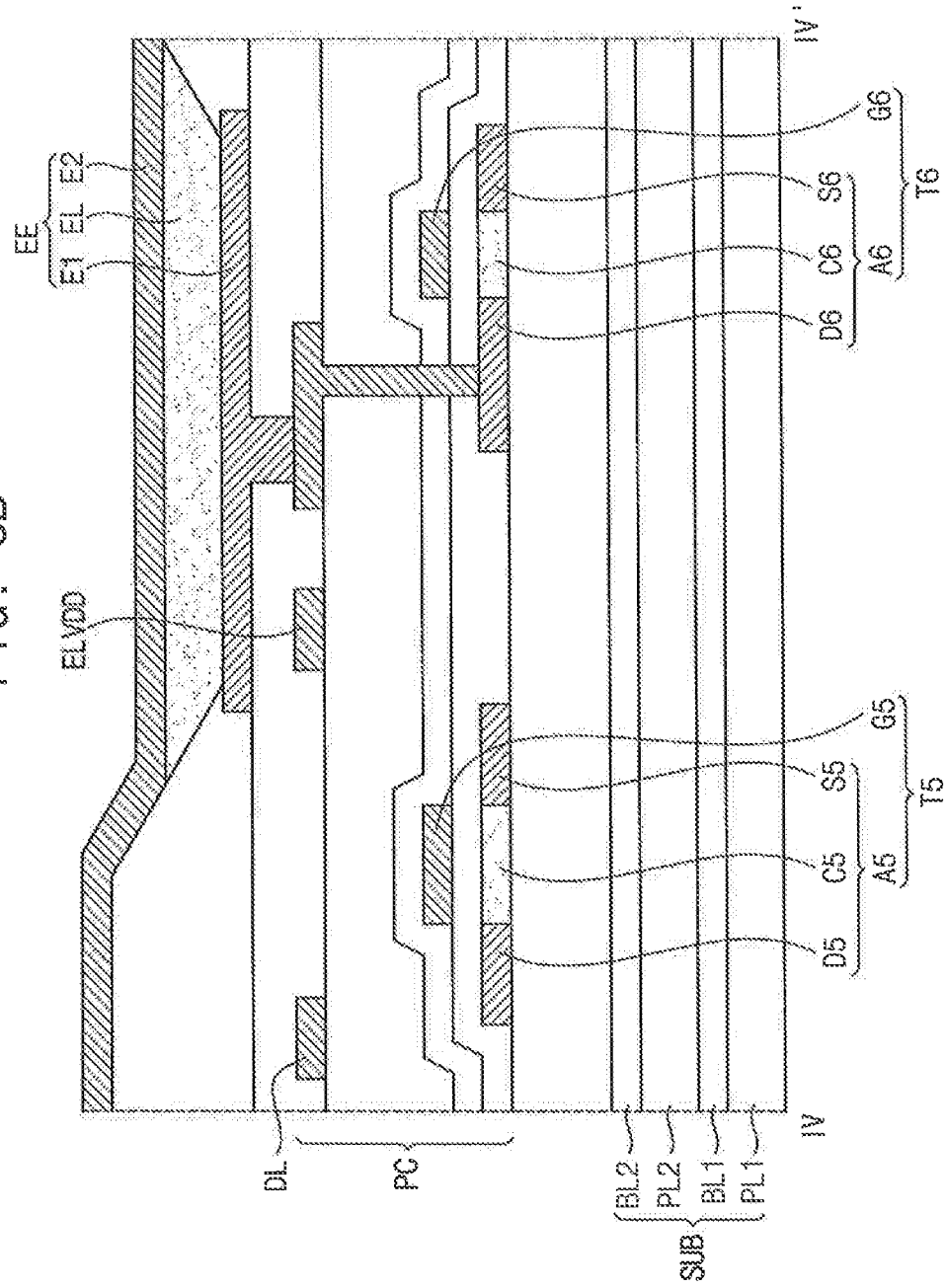

FIG. 4 is a layout view illustrating the pixel in FIG. 3, according to an exemplary embodiment of the present inventive concept. FIG. 5 is a layout view illustrating a conductive pattern and an active pattern of the pixel in FIG. 4, according to an exemplary embodiment of the present inventive concept. FIGS. 6A and 6B are cross-sectional views illustrating the display device in FIG. 4 taken along a line I-I' and a line IV-IV', according to an exemplary embodiment of the present inventive concept.

Figure 12:
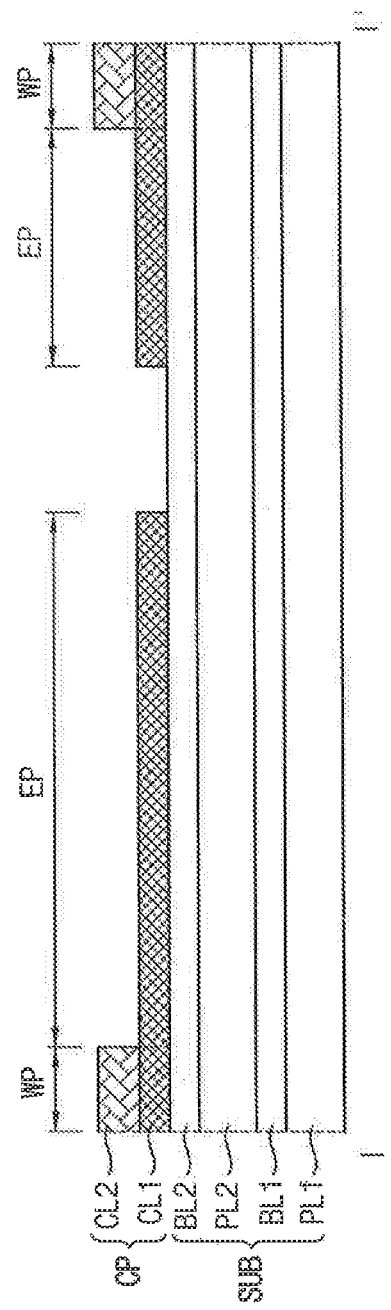

Referring to FIGS. 4, 5, 6A, and 6B, a pixel of a display device according to an exemplary embodiment of the inventive concept may include a pixel circuit PC including a first thin film transistor T1, a second thin film transistor T2, a third thin film transistor T3, a fourth thin film transistor T4, a fifth thin film transistor T5, a sixth thin film-transistor T6, a seventh thin film transistor T7, a capacitor Cst, and a gate bridge GB selectively connected to a first scan line Sn, a second scan line Sn-1, a third scan line Sn-2, an emission control line EM, a data line DL, a driving voltage line ELVDD, and an initialization voltage line Vint, and a light emitting element EE connected to the pixel circuit PC. A conductive pattern CP may traverse the pixel circuit PC, and may include an electrode portion EP and a wiring portion WP. The wiring portion WP of the conductive pattern CP may include a first conductive layer CL1 and a second conductive layer CL2. The electrode portion EP of the conductive pattern CP may include the first conductive layer CL1 not overlapped by the second conductive layer CL2. This is illustrated in FIG. 12 more detail. The electrode portion EP of the conductive pattern CP may overlap a first active pattern A1 of the first thin film transistor T1 and a third active pattern A3 of the third thin film transistor T3. The wiring portion WP of the conductive pattern CP may be located outside the pixel circuit PC, and may be connected to the electrode portion EP to supply a voltage thereto.

A substrate SUB may be an insulating substrate including glass, polymer, or stainless steel. In an exemplary embodiment of the present inventive concept, the substrate SUB may include a first plastic layer PL1, a first barrier layer BL1, a second plastic layer PL2, and a second barrier layer BL2, which are sequentially stacked. For example, the first and second plastic layers PL1 and PL2 may include plastic such as polyimide (PI), polyethylene naphthalate (PEN), polyethylene terephthalate (PET), polyarylate (PAR), polycarbonate (PC), polyetherimide (PEI), polyethersulfone (PS), or the like. The first and second barrier layers BL1 and BL2 may include silicon compounds such as amorphous silicon (a-Si), silicon oxide ($SiO_x$), silicon nitride ($SiN_x$), or the like.

The first thin film transistor T1 may be located on the substrate SUB, and may include the first active pattern A1 and a first gate electrode G1. The first active pattern A1 may include a first source electrode S1, a first channel C1, and a first drain electrode D1. The first source electrode S1 may be connected to a second drain electrode D2 of the second thin film transistor T2 and a fifth drain electrode D5 of the fifth thin film transistor T5. The first drain electrode D1 may be connected to a third source electrode S3 of the third thin film transistor T3 and a sixth source electrode S6 of the sixth thin film transistor T6.

The first active pattern A1 may be formed of a polysilicon or an oxide semiconductor. The oxide semiconductor may include an oxide based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide (In—Ga—Zn—O), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

The first channel C1 of the first active pattern A1 may be a channel doped with an N-type impurity or a P-type impurity. The first source electrode S1 and the first drain electrode D1 may be spaced apart from each other with the first channel C1 interposed therebetween. In addition, the first source electrode S1 and the first drain electrode D1 may be doped with an impurity opposite that which is used to dope the first channel C1.

The first gate electrode G1 may be located on the first channel C1 of the first active pattern A1, and may have an island shape. The first gate electrode G1 may be connected to a fourth drain electrode D4 of the fourth thin film transistor T4 and a third drain electrode D3 of the third thin film transistor T3 by the gate bridge GB passing through a contact hole. The first gate electrode G1 may overlap a capacitor electrode CE. The first gate electrode G1 may function as a gate electrode of the first thin film transistor T1, and may also function as an electrode of the capacitor Cst. In other words, the first gate electrode G1 may configure the capacitor Cst together with the capacitor electrode CE.

The conductive pattern CP may be located between the first active pattern A1 and the substrate SUB. The first channel C1 of the first active pattern A1 may overlap the electrode portion EP of the conductive pattern CP, and a voltage may be supplied to the electrode portion EP such that charges such as electrons or holes may be stored at the first channel C1 of the first active pattern A1. The charges stored at the first channel C1 of the first active pattern A1 may depend on a polarity of the voltage supplied to the electrode portion EP, thereby controlling a threshold voltage of the first thin film transistor T1. In other words, the threshold voltage of the first thin film transistor T1 may be increased or decreased by use of the electrode portion EP of the conductive portion CP, and hysteresis that can occur at the first thin film transistor T1 may be improved by controlling the threshold voltage of the first thin film transistor T1.

The second thin film transistor T2 may be located on the substrate SUB, and may include a second active pattern A2 and a second gate electrode G2. The second active pattern A2 may include a second source electrode S2, a second channel C2, and a second drain electrode D2. The second source electrode S2 may be connected to the data line DL, through a contact hole, and the second drain electrode D2 may be connected to the first source electrode S1 of the first thin film transistor T1. The second channel C2 that is a channel region of the second active pattern A2 overlapping the second gate electrode G2 may be located between the second source electrode S2 and the second drain electrode D2. The second active pattern A2 may be connected to the first active pattern A1.

The second channel C2 of the second active pattern A2 may be a channel doped with an N-type impurity or a P-type impurity. The second source electrode S2 and the second drain electrode D2 may be spaced apart from each other with the second channel C2 therebetween. The second source electrode S2 and the second drain electrode D2 may be doped with an opposite type of impurity to that with which the second channel C2 is doped. The second active pattern A2 may be located on the same layer as the first active pattern A1, may be formed of the same material as the first active pattern A1, and may be integrally formed with the first active pattern A1.

The second gate electrode G2 may be located on the second channel C2 of the second active pattern A2, and may be integrally formed with the first scan line Sn. The conductive pattern CP may not be located between the second active pattern A2 and the substrate SUB, and the second channel C2 of the second active pattern A2 may not overlap the conductive pattern CP.

The third thin film transistor T3 may be located on the substrate SUB, and may include a third active pattern A3 and a third gate electrode G3. The third active pattern A3 may include a third source electrode S3, a third channel C3, and a third drain electrode D3. The third source electrode S3 may be connected to the first drain electrode D1, and the third drain electrode D3 may be connected to the first gate electrode G1 of the first thin film transistor T1 by the gate bridge GB passing through the contact hole. The third channel C3 that is a channel region of the third active pattern A3 overlapping the third gate electrode G3 may be located between the third source electrode S3 and the third drain electrode D3. The third active pattern A3 may connect between the first active pattern A1 and the first gate electrode G1.

The third channel C3 of the third active pattern A3 may be a channel doped with an N-type impurity or a P-type impurity. The third source electrode S3 and the third drain electrode D3 may be spaced apart from each other with the third channel C3 therebetween. The third source electrode S3 and the third drain electrode D3 may be doped with an opposite type of impurity to that with which the third channel C3 is doped. The third active pattern A3 may be located on the same layer as the first and second active patterns A1 and A2, may formed of the same material as the first and second active patterns A1 and A2, and may be integrally formed with the first and second active patterns A1 and A2.

The third gate electrode G3 may be located on the third channel C3 of the third active pattern A3, and may be integrally formed with the first scan line Sn. The third gate electrode G3 may be a dual-gate electrode.

The conductive pattern CP may be located between the third active pattern A3 and the substrate SUB. The third channel C3 of the third active pattern A3 may overlap the electrode portion EP of the conductive pattern CP, and a voltage may be supplied to the electrode portion EP such that charges such as electrons or holes may be stored at the third channel C3 of the third active pattern A3. The charges stored at the third channel C3 of the third active pattern A3 may depend on a polarity of the voltage supplied to the electrode portion EP, thereby controlling a threshold voltage of the third thin film transistor T3. In other words, the threshold voltage of the third thin film transistor T3 may be increased or decreased by use of the electrode portion EP of the conductive pattern CP, and hysteresis that can occur at the third thin film transistor T3 may be improved by controlling the threshold voltage of the third thin film transistor T3.

The fourth thin film transistor T4 may be located on the substrate SUB, and may include a fourth active pattern A4 and a fourth gate electrode G4. The fourth active pattern A4 may include a fourth source electrode S4, a fourth channel C4, and a fourth drain electrode D4. The fourth source electrode S4 may be connected to the initialization voltage line Vint through the contact hole, and the fourth drain electrode D4 may be connected to the first gate electrode G1 of the first thin film transistor T1 through the gate bridge GB passing through the contact hole. The fourth channel C4 that is a channel region of the fourth active pattern A4 overlapping the fourth gate electrode G4 may be located between the fourth source electrode S4 and the fourth drain electrode D4. The fourth active pattern A4 may connect between the initialization voltage line Vint and the first gate electrode G1, and may be connected to the third active pattern A3 and the first gate electrode G1.

The fourth channel C4 of the fourth active pattern A4 may be a channel doped with an N-type impurity or a P-type impurity. The fourth source electrode S4 and the fourth drain electrode D4 may be spaced apart from each other with the fourth channel C4 therebetween, and may be doped with an opposite type of impurity to that with which the fourth channel C4 is doped. The fourth active pattern A4 may be located on the same layer as the first, second, and third active patterns A1, A2, and A3, may be formed of the same material as the first, second, and third active patterns A1, A2, and A3, and may be integrally formed with the first, second, and third active patterns A1, A2, and A3.

The fourth gate electrode G4 may be located on the fourth channel C4 of the fourth active pattern A4, and may be integrally formed with the second scan line Sn-1. The fourth gate electrode G4 may be a dual-gate electrode. The conductive pattern CP may not be located between the fourth active pattern A4 and the substrate SUB, and the fourth channel C4 of the fourth active pattern A4 may not overlap the electrode portion EP of the conductive pattern CP.

The fifth thin film transistor T5 may be located on the substrate SUB, and may include a fifth active pattern A5 and a fifth gate electrode G5. The fifth active pattern A5 may include a fifth source electrode S5, a fifth channel C5, and a fifth drain electrode D5. The fifth source electrode S5 may be connected to the driving voltage line ELVDD through the contact hole, and the fifth drain electrode D5 may be connected to the first source electrode S1 of the first thin film transistor T1. The fifth channel C5 that is a channel region of the fifth active pattern A5 overlapping the fifth gate electrode G5 may be located between the fifth source electrode S5 and the fifth drain electrode D5. The fifth active pattern A5 may connect between the driving voltage line ELVDD and the first active pattern A1.

The fifth channel C5 of the fifth active pattern A5 may be a channel doped with an N-type impurity or a P-type impurity. The fifth source electrode S5 and the fifth drain electrode to D5 may be spaced apart from each other with the fifth channel C5 therebetween, and may be doped with an opposite type of impurity to that with which the fifth channel C5 is doped. The fifth active pattern A5 may be located on the same layer as the first to fourth active patterns A1, A2, A3, and A4, may be formed of the same material as the first to fourth active patterns A1, A2, A3, and A4, and may be integrally formed with the first to fourth active patterns A1, A2, A3, and A4.

The fifth gate electrode G5 may be located on the fifth channel C5 of the fifth active pattern A5, and may be integrally formed with the emission control line EM. The conductive pattern CP may not be located between the fifth active pattern A5 and the substrate SUB, and the fifth channel C5 of the fifth active pattern A5 may not overlap the electrode portion EP of the conductive pattern CP.

The sixth thin film transistor T6 may be located on the substrate SUB, and may include a sixth active pattern A6 and a sixth gate electrode G6. The sixth active pattern A6 may include a sixth source electrode S6, a sixth channel C6, and a sixth drain electrode D6. The sixth source electrode S6 may be connected to the first drain electrode D1 of the first thin film transistor T1, and the sixth drain electrode D6 may be connected to a first electrode E1 of the light emitting element EE through a contact hole. The sixth channel C6 that is a channel region of the sixth active pattern A6 overlapping the sixth gate electrode G6 may be located between the sixth source electrode S6 and the sixth drain electrode D6. The sixth active pattern A6 may connect between the first active pattern A1 and the first electrode E1 of the light emitting element EE.

The sixth channel C6 of the sixth active pattern A6 may be a channel doped with an N-type impurity or a P-type impurity. The sixth source electrode S6 and the sixth drain electrode D6 may be spaced apart from each other with the sixth channel C6 therebetween, and may be doped with an opposite type of impurity to that with which the sixth channel C6 is doped. The sixth active pattern A6 may be located on the same layer as the first to fifth active patterns A1, A2, A3, A4, and A5, may be formed of the same material as the first to fifth active patterns A1, A2, A3, A4, and A5, and may be integrally formed with the first to fifth active patterns A1, A2, A3, A4, and A5.

The sixth gate electrode G6 may be located on the sixth channel C6 of the sixth active pattern A6, and may be integrally formed with the emission control line EM. The conductive pattern CP may not be located between the sixth active pattern A6 and the substrate SUB, and the sixth channel C6 of the sixth active pattern A6 may not overlap the electrode portion EP of the conductive pattern CP.

The seventh thin film transistor T7 may be located on the substrate SUB, and may include a seventh active pattern A7 and a seventh gate electrode G7. The seventh active pattern A7 may include a seventh source electrode S7, a seventh channel C7, and a seventh drain electrode D7. The seventh source electrode S7 may be connected to a first electrode of a light emitting element EE of another pixel (e.g., another pixel located on a bottom portion of the pixel shown in FIG. 4), and the seventh drain electrode D7 may be connected to the fourth source electrode S4 of the fourth thin film transistor T4. The seventh channel C7 that is a channel region of the seventh active pattern A7 overlapping the seventh gate electrode G7 may be located between the seventh source electrode S7 and the seventh drain electrode D7. The seventh active pattern A7 may connect between the first electrode E1 of the light emitting element EE and the fourth active pattern A4.

The seventh channel C7 of the seventh active pattern A7 may be a channel doped with an N-type impurity or a P-type impurity. The seventh source electrode S7 and the seventh drain electrode D7 may be spaced apart from each other with the seventh channel C7 therebetween, and may be doped with an opposite type of impurity to that with which the seventh channel C7 is doped. The seventh active pattern A7 may be located on the same layer as the first to sixth active patterns A1, A2, A3, A4, A5, and A6, may be formed of the same material as the first to sixth active patterns A1, A2, A3, A4, A5, and A6, and may be integrally formed with the first to sixth active patterns A1, A2, A3, A4, A5, and A6.

The seventh gate electrode G7 may be located on the seventh channel C7 of the seventh active pattern A7, and may be integrally formed with the third scan line Sn-2. The conductive pattern CP may not be located between the seventh active pattern A7 and the substrate SUB, and the seventh channel C7 of the seventh active pattern A7 may not overlap the electrode portion EP of the conductive pattern CP.

The first scan line Sn may be located on the second active pattern A2 and the third active pattern A3 and extended in a direction traversing the second active pattern A2 and the third active pattern A3. The first scan line Sn may be integrally formed with the second gate electrode G2 of the second thin film transistor T2 and the third gate electrode G3 of the third thin film transistor T3 to be connected to the second gate electrode G2 and the third gate electrode G3.

The second scan line Sn-1 may be separated from the first scan line Sn, located on the fourth active pattern A4, and extended in a direction traversing the fourth active pattern A4. The second scan line Sn-1 may be integrally formed with the fourth gate electrode G4 of the fourth thin film transistor T4 and connected to the fourth gate electrode G4.

The third scan line Sn-2 may be separated from the second scan line Sn-1, located on to the seventh active pattern A7, and extended in a direction traversing the seventh active pattern A7. The third scan line Sn-2 may be integrally formed with the seventh gate electrode G7 of the seventh thin film transistor T7 and connected to the seventh gate electrode G7.

The emission control line EM may be separated from the first scan line Sn, located on the fifth active pattern A5 and the sixth active pattern A6, and extended in a direction traversing the fifth active pattern A5 and the sixth active pattern A6. The emission control line EM may be integrally formed with the fifth gate electrode G5 of the fifth thin film transistor T5 and the sixth gate electrode G6 of the sixth thin film transistor T6 and connected to the fifth gate electrode G5 and the sixth gate electrode G6.

The above-described emission control line EM, third scan line Sn-2, second scan line Sn-1, first scan line Sn, first gate electrode G1, second gate electrode G2, third gate electrode G3, fourth gate electrode G4, fifth gate electrode G5, sixth gate electrode G6, and seventh gate electrode G7 may be located on the same layer, and may be formed of the same material. In another exemplary embodiment of the present inventive concept, the emission control line EM, the third scan line Sn-2, the second scan line Sn-1, the first scan line. Sn, the first gate electrode G1, the second gate electrode G2, the third gate electrode G3, the fourth gate electrode G4, the fifth gate electrode G5, the sixth gate electrode G6, and the seventh gate electrode G7 may be located on different layers, and may be formed of different materials.

The capacitor Cst may include a first electrode E1 and a second electrode E2 facing each other with an insulation layer therebetween. The first electrode E1 may be the capacitor electrode CE, and the second electrode E2 may be the first gate electrode G1 of the first thin film transistor T1. The capacitor electrode CE may be located on the first gate electrode G1, and may be connected to a driving voltage line ELVDD through a contact hole. The capacitor electrode CE may configure the capacitor Cst together with the first gate electrode G1, and the first gate electrode G1 and the capacitor electrode CE may be formed of different metals or the same metal on different layers.

The capacitor electrode CE may include an opening OA overlapping part of the first gate electrode G1 of the first thin film transistor T1, and the gate bridge GB may be connected to the first gate electrode G1 through the opening OA. The capacitor electrode CE may overlap the electrode portion EP of the conductive pattern CP.

The data line DL may be located on the first scan line Sn, extended in a direction traversing the first scan line Sn, and connected to the second source electrode S2 of the second active pattern A2 through the contact hole. The data line DL may be extended to traverse the first scan line Sn, the second scan line Sn-1, the third scan line Sn-2, and the emission control line EM.

The driving voltage line ELVDD may be separated from the data line DL, provided on the first scan line Sn, and extended in a direction traversing the first scan line Sn. The driving voltage line ELVDD may be connected to the fifth source electrode S5 of the fifth active pattern A5 connected to the capacitor electrode CE and the first active pattern A1 through the contact hole. The driving voltage line ELVDD may be extended to traverse the first scan line Sn, the second scan line Sn-1, the third scan line Sn-2, and the emission control line EM.

The gate bridge GB may be located on the first scan line Sn and spaced from the driving voltage line ELVDD. The gate bridge GB may be connected to the third drain electrode D3 of the third active pattern A3 and the fourth drain electrode D4 of the fourth active pattern A4 through a contact hole. In addition, the gate bridge GB may be connected to the first gate electrode G1 exposed by the opening OA of the capacitor electrode CE through another contact hole.

The above-described data line DL, driving voltage line ELVDD, and gate bridge GB may be located on the same layer, and may be formed of the same material. In another exemplary embodiment of the present inventive concept, the data line DL, the driving voltage line ELVDD, and the gate bridge GB may be located on different layers, and may be formed of different materials.

The initialization voltage line Vint may be located on the second scan line Sn-1, and may be connected to the fourth source electrode S4 of the fourth active pattern A4 through the contact hole. The initialization voltage line Vint may be located on the same layer as the first electrode E1 of the light emitting element EE, and may be formed of the same material. In another exemplary embodiment of the present inventive concept, the initialization voltage line Vint may be located on a different layer from the first electrode E1, and may be formed of a different material.

The light emitting element EE may include a first electrode E1, an emission layer EL, and a second electrode E2. The first electrode E1 may be connected to the sixth drain electrode D6 of the sixth thin film transistor T6 through the contact hole. The emission layer EL may be located between the first electrode E1 and the second electrode E2. The second electrode E2 may be located on the emission layer EL. At least one of the first electrode E1 and the second electrode E2 may be a light transmittable electrode, a light reflective electrode, or a light semi-transmittable electrode, and the light emitted from the emission layer EL may be output in at least one electrode direction of the first electrode E1 and the second electrode E2.

The emission layer EL may include at least one of an organic light emitting material and a quantum dot material. In an exemplary embodiment of the present inventive concept, the organic light emitting material may include a low molecular weight polymer or a high molecular weight polymer. For example, the low molecular weight polymer may include copper phthalocyanine, N,N'-diphenylbenzidine, tris-(8-hydroxyquinoline)aluminum, etc., and the high molecular weight polymer may include poly(3,4-ethylenedioxythiophene), polyaniline, poly-phenylenevinylene, polyfluorene, etc.

In an exemplary embodiment of the present inventive concept, the quantum dot material may include a core that includes a group II-VI compound, a group III-V compound, a group IV-VI compound, a group IV element, a group IV compound, and a combination thereof. For example, the group II-VI compound may include CdSe, CdTe, ZnS, ZnSe, ZnTe, ZnO, HgS, HgSe, HgTe, MgSe, MgS, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, HgZnTeS, CdZnSeS, CdZnSeTe, CdZnSTe, CdHgSeS, CdHgSeTe, CdHgSTe, HgZnSeS, HgZnSeTe, HgZnSTe, etc., and the group III-V compound may include GaN, GaP, GaAs, GaSb, AlN, AlP, AlAs, AlSb, InN, InSb, InP, InAs, InSb, GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, etc.

For example, the group IV-VI compound may include SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, etc., the group IV element may include Si, Ge, etc., and the group IV compound may include SiC, SiGe, etc.

In an exemplary embodiment of the present inventive concept, the quantum dot material may have a core-shell structure that includes the core and a shell surrounding the core. The shell may serve as a protective layer for preventing chemical degeneration of the core to maintain a semiconductor property of the core and a charging layer for imparting an electrophoretic property to the quantum dot material.

The shell may include, for example, a metallic or nonmetallic oxide material, a semiconductor compound, and a combination thereof. For example, the metallic or nonmetallic oxide material may include $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, $MgAl_2O_4$, $CoFe_2O_4$, $NiFe_2O_4$, $CoMn_2O_4$, etc., and the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc.

A capping layer for covering the light emitting element EE may be located on the light emitting element EE, and a thin film encapsulation layer or an encapsulation substrate may be located on the light emitting element EE with the capping layer therebetween.

The conductive pattern CP may be located between the first active pattern A1 of the first thin film transistor T1 and the substrate SUB, and between the third active pattern A3 of the third thin film transistor T3 and the substrate SUB. The electrode portion EP of the conductive pattern CP may overlap the first channel C1 of the first active pattern A1 and the third channel C3 of the third active pattern A3. The wiring portion WP of the conductive pattern CP may be connected to the electrode portion EP to supply voltage thereto.

The electrode portion EP of the conductive pattern CP to which voltage is supplied may overlap the first active pattern A1 of the first thin film transistor T1 and the third active pattern A3 of the third thin film transistor T3. In this case, the display device according to an exemplary embodiment of the present inventive concept may control threshold voltages of the first and third thin film transistors T1 and T3, thereby improving transistor characteristics of the first and third thin film transistors T1 and T3. Therefore, the light emission efficiency of the light emitting element EE electrically connected to the first thin film transistor T1 may be improved.

For example, the first thin film transistor T1 may be a driving thin film transistor connected to the light emitting element EE, and the third thin film transistor T3 may be a complementary thin film transistor for connecting between the first drain electrode D1 and the first gate electrode G1 of the first thin film transistor T1. The first and third thin film transistors T1 and T3 may be thin film transistors that impart an actual influence to a current supplied to the light emitting element EE. The first channel C1 of the first thin film transistor T1 and the third channel C3 of the third thin film transistor T3 may overlap the electrode portion EP of the conductive pattern CP, a voltage may be supplied to the electrode portion EP of the conductive pattern CP, and charges such as electrons or holes may be resultantly supplied to the first channel C1 and the third channel C3. The charges are supplied to the first and third channels C1 and C3 according to the polarity of the voltage supplied to the electrode portion EP of the conductive pattern CP, thereby controlling the threshold voltages of the first and third thin film transistors T1 and T3.

In other words, the threshold voltages of the first and third thin film transistors T1 and T3 may be increased or reduced by using the electrode portion EP of the conductive pattern CP, and the hysteresis that can occur at the first and third thin film transistors T1 and T3 may be improved by controlling the threshold voltages of the first and third thin film transistors T1 and T3. In this case, the light emission efficiency of the light emitting element EE electrically connected to the first thin film transistor T1 may be improved. The transistor characteristics of the first thin film transistor T1 that is a driving thin film transistor and the third thin film transistor T3 that is a complementary thin film transistor may be improved by using the conductive pattern CP. Therefore, the display device with improved emission efficiency of the light emitting element EE may be provided.

As described above, the width WPW of the wiring portion WP of the conductive pattern CP may be less than the with EPW of the electrode portion EP of the conductive pattern CP. For example, the width WPW of the wiring portion WP in the first direction DR1 may be less than the width EPW of the electrode portion EP in the first direction DR1. In this case, if the wiring portion WP and the electrode portion EP of the conductive pattern CP are formed of the same material with the same thickness, a current of the wiring portion WP may be less than a current of the electrode portion EP because a resistance of the wiring portion WP is greater than a resistance of the electrode portion EP. Therefore, voltage transmitted from the wiring portion WP to the electrode portion EP may be delayed.

A thickness of the wiring portion WP of the conductive pattern CP may be greater than a thickness of the electrode portion EP of the conductive pattern CP. In an exemplary embodiment of the present inventive concept, the thickness of the electrode portion EP may be in a range from about 500 Å to about 1000 Å, and the thickness of the wiring portion WP may be in a range from about 2000 Å to about 3000 Å. The thickness of the wiring portion WP may be greater than the thickness of the electrode portion EP, so that a resistance of the wiring portion WP may not be less than a resistance of the electrode portion EP although the width WPW of the wiring portion WP is less than the width EPW of the electrode portion. Therefore, voltage transmitted to the electrode portion EP of the conductive pattern CP may not be delayed.

The conductive pattern CP may include a first conductive layer CL1 and a second conductive layer CL2. The first conductive layer CL1 may be formed in the electrode portion EP and the wiring portion WP, and the second conductive layer CL2 may be formed in the wiring portion WP. In other words, the second conductive layer CL2 may not be formed in the electrode portion EP. Accordingly, the thickness of the wiring portion WP may be greater than the thickness of the electrode portion EP. In an exemplary embodiment of the present inventive concept, a thickness of the first conductive layer CL1 may be in a range from about 500 Å to about 1000 Å, and a thickness of the second conductive layer CL2 may be in a range from about 1500 Å to about 2000 Å.

Each of the first conductive layer CL1 and the second conductive layer CL2 may include metal such as molybdenum (Mo), however, the present inventive concept is not limited thereto. Each of the first conductive layer CL1 and the second conductive layer CL2 may include other materials such as conductive polymer, etc. The first conductive layer CL1 and the second conductive layer CL2 may include the same material or different materials.

Hereinafter, a method of manufacturing a display device according to an exemplary embodiment of the present inventive concept will be described with reference to FIGS. 7 to 12.

FIGS. 7, 8, 9, 10, 11, and 12 are cross-sectional views illustrating a method of manufacturing a display device according to an exemplary embodiment of the present inventive concept. For example, FIGS. 7 to 12 may illustrate a method of manufacturing the display device in FIG. 6A.

Figure 7:
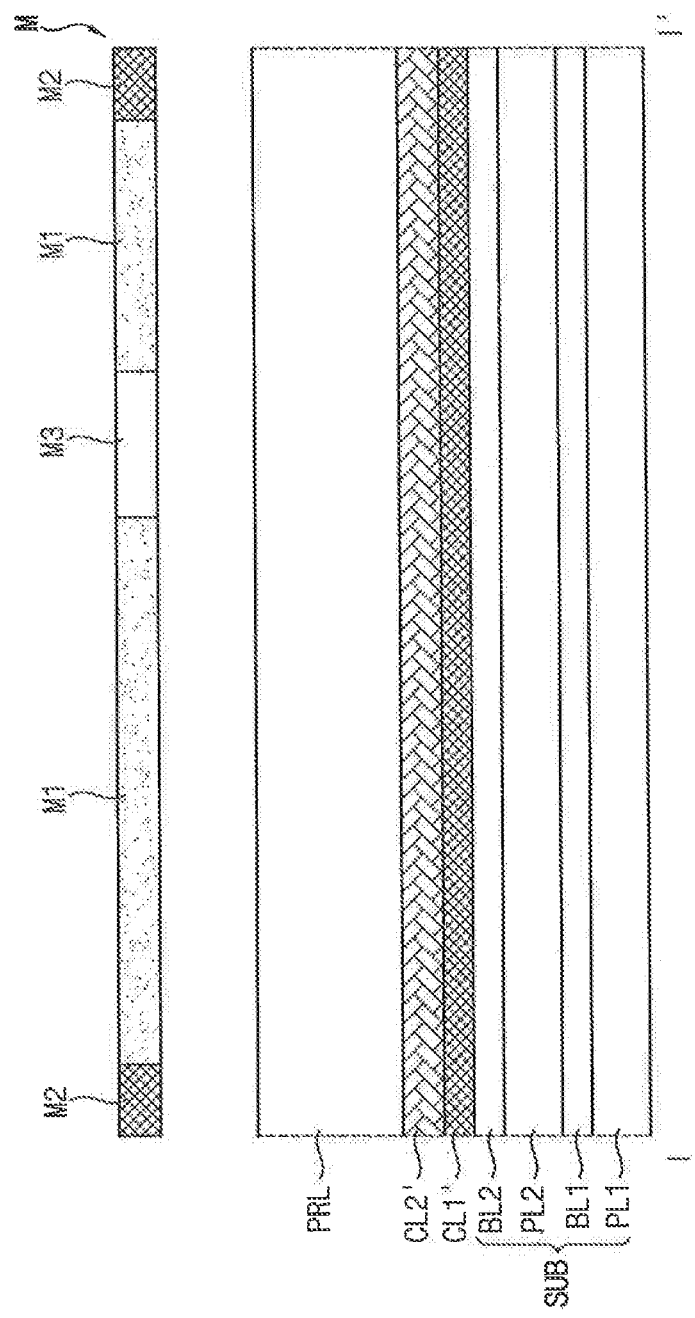
FIGS. 7, 8, 9, 10, 11, and 12 are cross-sectional views illustrating a method of manufacturing a display device according to an exemplary embodiment of the present inventive concept.

Referring to FIG. 7, a first preliminary conductive layer CL1', a second preliminary conductive layer CL2', and a photoresist layer PRL may be sequentially formed on the substrate SUB. The first preliminary conductive layer CL1' and the second preliminary conductive layer CL2' may be formed of a metal such as molybdenum (MO), a conductive polymer, etc., and the photoresist layer PRL may be formed of a photosensitive organic material such as polyimide (PI), etc.

A photo mask M may be used to irradiate light to the photoresist layer PRL. The photo mask M may be a halftone mask or a slit mask. In an exemplary embodiment of the present inventive concept, when the photo mask M is the halftone mask, the halftone mask M may include a transmission portion M3, a shielding portion M2, and a transflective portion M1. The transmission portion M3 may correspond to a region in which the photoresist layer PRL is entirely removed, the shielding portion M2 may correspond to a region in which the photoresist layer PRL is entirely remained, and the transflective portion M1 may correspond to a region in which the photoresist layer PRL is partially remained. In another exemplary embodiment of the present inventive concept, when the photo mask M is the slit mask, the slit mask M may include a slit portion M1 including at least one slit bar that blocks light, a transmission portion M3, and a shielding portion M2.

Figure 8:
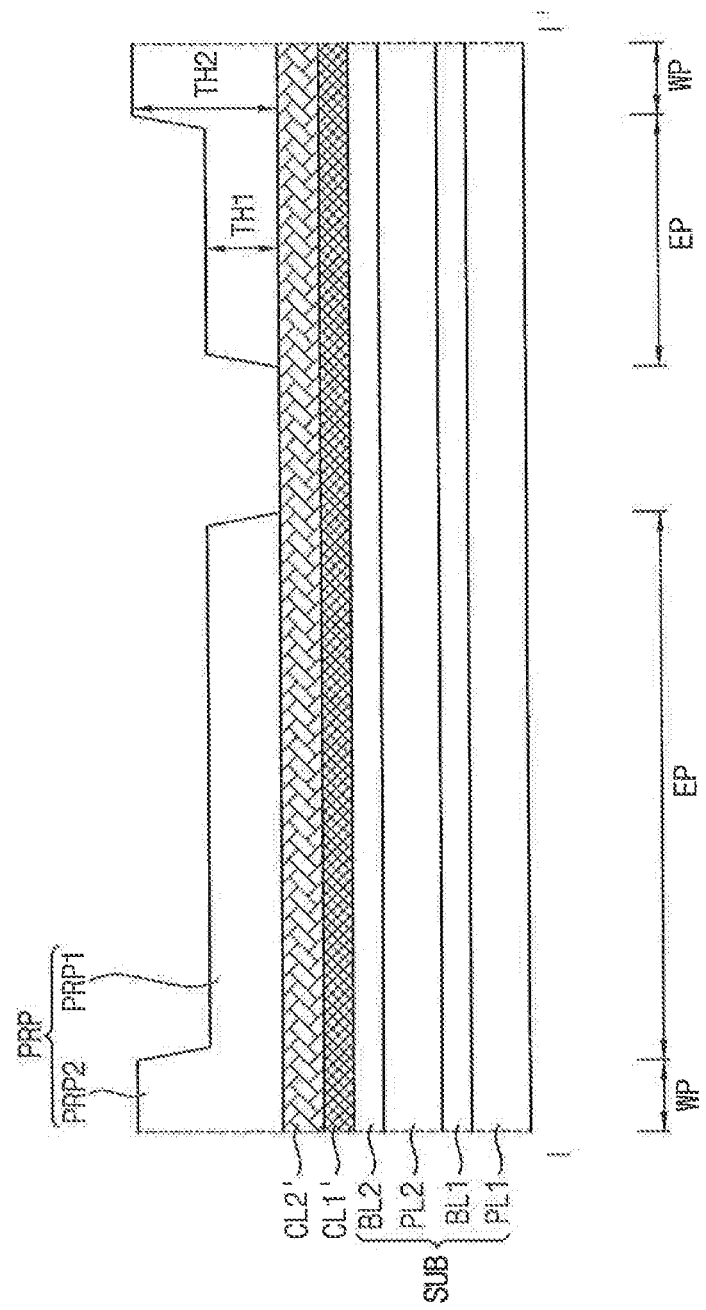

Referring to FIG. 8, a portion of the photoresist layer PRL to which light is irradiated through the transmission portion M3 may be entirely removed, and a portion of the photoresist layer PRL to which light is irradiated through the transflective portion M1 may be partially removed, so that a photoresist pattern PRP including a first area PRP1 corresponding to the electrode portion EP of the conductive pattern and a second area PRP2 corresponding to the wiring portion WP of the conductive pattern may be formed. The first area PRP1 may have a first thickness TH1, and the second area PRP2 may have a second thickness TH2 greater than the first thickness TH1.

Figure 9:
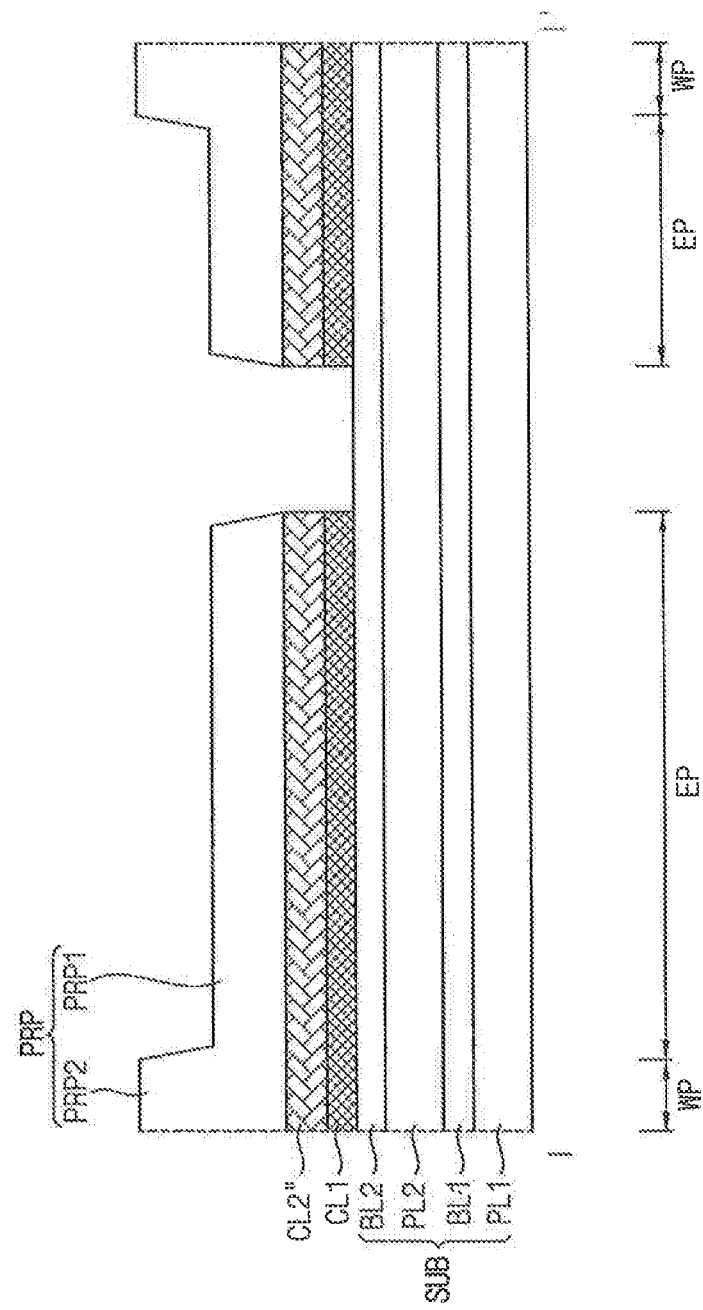

Referring to FIG. 9, a portion of the first and second preliminary conductive layers CL1' and CL2' may be etched to form the first conductive layer CL1. The portion of the first and second preliminary conductive layers CL1' and CL2' except a region where the electrode portion EP and the wiring portion WP of the conductive pattern will be formed may be etched by using the photoresist pattern PRP as an etch-stopper. Accordingly, the first conductive layer CL1 and the second preliminary conductive layer CL2" that is partially etched may be formed.

Figure 10:
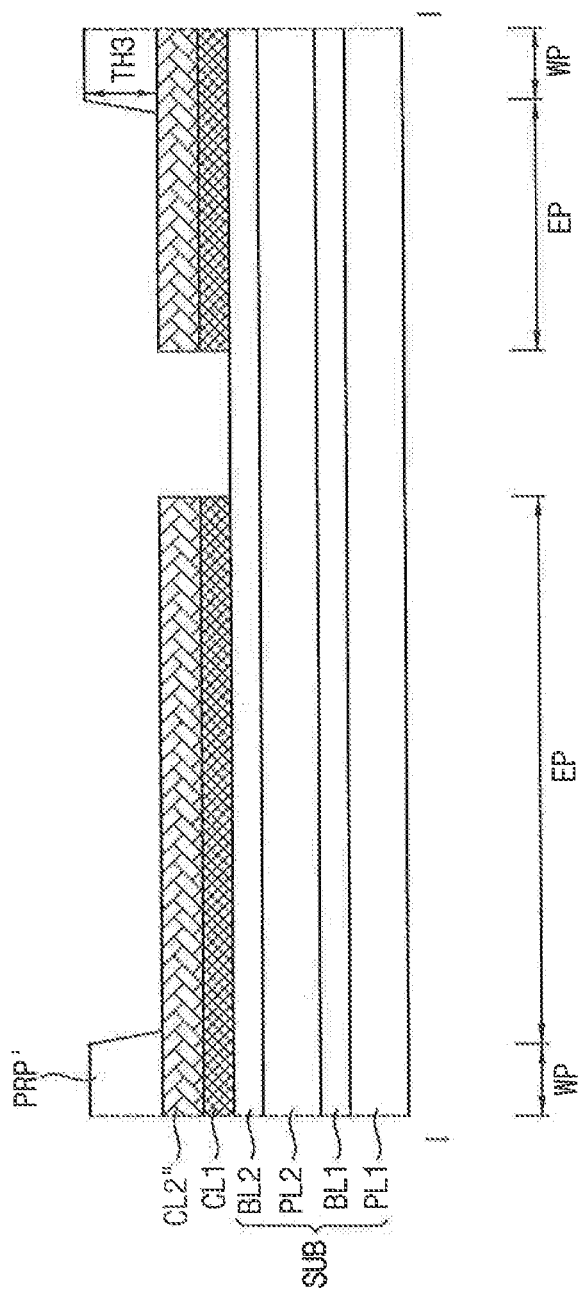

Referring to FIG. 10, the photoresist pattern PRP may be removed by at least the first thickness TH1. For example, the photoresist pattern PRP may be partially removed by using an etch-back process. Because the thickness of the photoresist pattern PRP is removed by at least the first thickness TH1, the first area PRP1 of the photoresist pattern PRP having the first thickness TH1 may be removed, and a thickness of the second area PRP2 of the photoresist pattern PRP having the second thickness TH2 may decrease by at least the first thickness TH1. Accordingly, an etch-backed photoresist pattern PRP' corresponding to the second area PRP2 of the photoresist pattern PRP and having a third thickness TH3 that is decreased from the second thickness TH2 by at least the first thickness TH1 may be formed. In this case, a portion of the partially etched second preliminary conductive layer CL2" corresponding to the electrode portion EP of the conductive pattern may be exposed.

Figure 11:
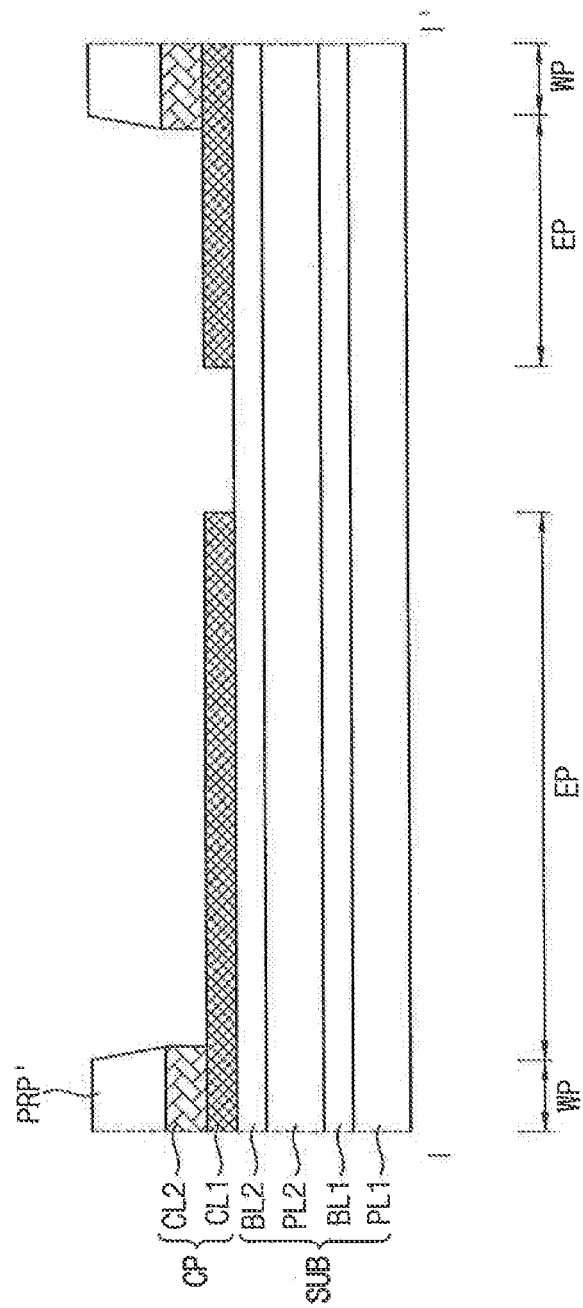

Referring to FIG. 11, the second preliminary conductive layer CL2" may be partially etched to form the second conductive layer CL2. A portion of the second preliminary conductive layer CL2" except a region where the electrode portion EP of the conductive pattern will be formed may be etched by using the etch-backed photoresist pattern PRP' as an etch-stopper. Accordingly, the conductive pattern CP including the first conductive layer CL1 commonly formed in the electrode portion EP and the wiring portion WP, and the second conductive layer CL2 formed in the wiring portion WP may be formed.

Referring to FIG. 12, the etch-backed photoresist pattern PRP' may be removed. For example, the etch-backed photoresist pattern PRP' may be removed by using an ashing, etc.

Referring to FIG. 6A, the pixel circuit PC including the thin film transistors (e.g., T1 or T3) and the capacitor (e.g., Cst) may be formed on the conductive pattern CP. The active pattern (e.g., A1 or A3) of at least one of the thin film transistors (e.g., T1 or T3) may overlap the electrode portion EP of the conductive pattern CP. In an exemplary embodiment of the present inventive concept, the first thin film transistor T1 including the first active pattern A1 overlapping the electrode portion EP of the conductive pattern CP and the third thin film transistor T3 including the third active pattern A3 overlapping the electrode portion EP of the conductive pattern CP may be formed on the conductive pattern CP. For example, the first active pattern A1 including the first channel C1 overlapping the electrode portion EP and the third active pattern A3 including the third channel C3 overlapping the electrode portion EP may be formed on the conductive pattern CP. In addition, the first gate electrode G1 and the third gate electrode G3 may be formed on the first active pattern A1 and the third active pattern A3, respectively.

The light emitting element EE electrically connected to the pixel circuit PC may be formed on the pixel circuit PC. The light emitting element EE may be electrically connected to at least one of the thin film transistors (e.g., T1 or T3) of the pixel circuit PC.

Hereinafter, a display device according to another exemplary embodiment of the present inventive concept will be described with reference to FIGS. 13 to 16.

Hereinafter, elements of the display device according to the present exemplary embodiment, which are different from those of the display device according to the previous exemplary embodiment, will be described.

Figure 13:
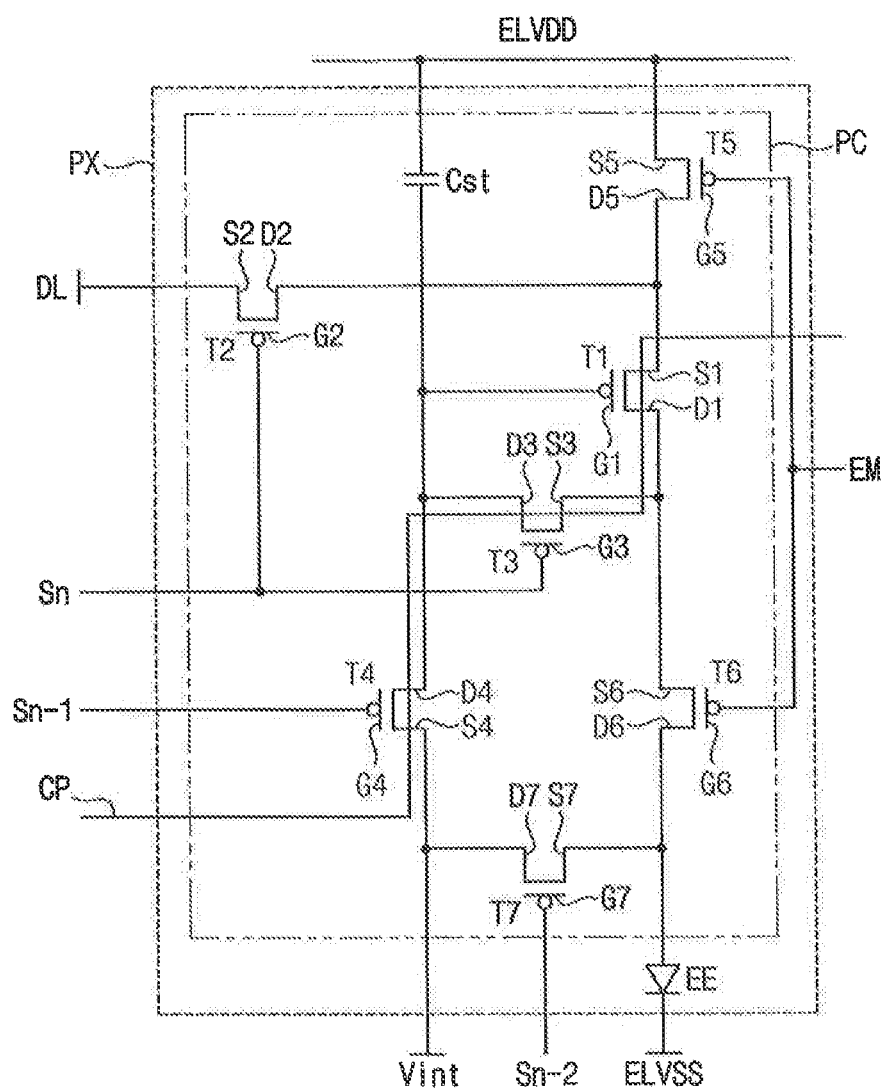
FIG. 13 a circuit diagram illustrating a pixel of a display device according to another exemplary embodiment of the present inventive concept.

FIG. 13 is a circuit diagram illustrating a pixel of a display device according to another exemplary embodiment of the present inventive concept.

Referring to FIG. 13, a pixel PX of the display device according to another exemplary embodiment of the present inventive concept may include a pixel circuit PC and a light emitting element EE connected to the pixel circuit PC. The pixel circuit PC may include a plurality of thin film transistors T1, T2, T3, T4, T5, T6, and T7 and a capacitor Cst. The thin film transistors T1, T2, T3, T4, T5, T6, and T7 may be selectively connected to a first scan line Sn, a second scan line Sn-1, a third scan line Sn-2, an emission control line EM, an initialization voltage line Vint, a data line DL, and a driving voltage line ELVDD.

The above-described conductive pattern CP may pass through some thin film transistors T1, T3, and T4 among the thin film transistors T1, T2, T3, T4, T5, T6, and T7 included in the pixel circuit PC. The conductive pattern CP may overlap an active pattern of the thin film transistors T1, T3, and T4.

The fourth thin film transistor T4 may include a fourth gate electrode G4 connected to the second scan line Sn-1, a fourth source electrode S4 connected to the initialization voltage line Vint, and a fourth drain electrode D4 connected to the first gate electrode G1 of the first thin film transistor T1. The conductive pattern CP may pass through the fourth thin film transistor T4. For example, the conductive pattern CP may traverse the pixel circuit PC, and may overlap the active pattern of the fourth thin film transistor T4. The conductive pattern CP may also overlap the first thin film transistor T1 and the third thin film transistor T3.

Hereinafter, an arrangement of a pixel of the display device according to the present embodiment will be described with reference to FIGS. 14 to 16.

Figure 14:
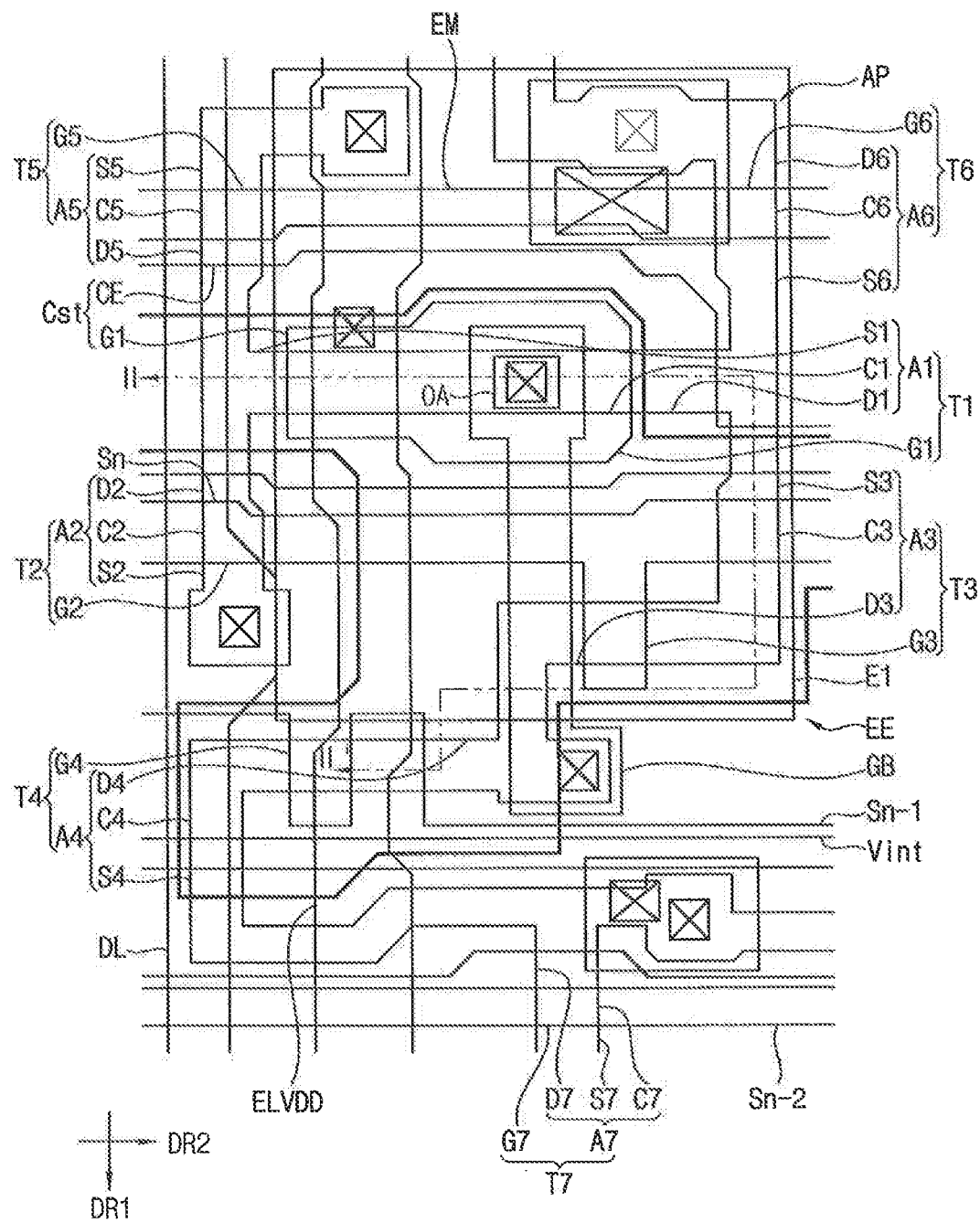
FIG. 14 is a layout view illustrating the pixel in FIG. 13, according to an exemplary embodiment of the present inventive concept.

FIG. 14 is a layout view illustrating the pixel in FIG. 13, according to an exemplary embodiment of the present inventive concept. FIG. 15 is a layout view illustrating a conductive pattern and an active pattern of the pixel in FIG. 14, according to an exemplary embodiment of the present inventive concept. FIG. 16 is a cross-sectional view illustrating the display device in FIG. 14 taken along a line II-II', according to an exemplary embodiment of the present inventive concept.

Figure 15:
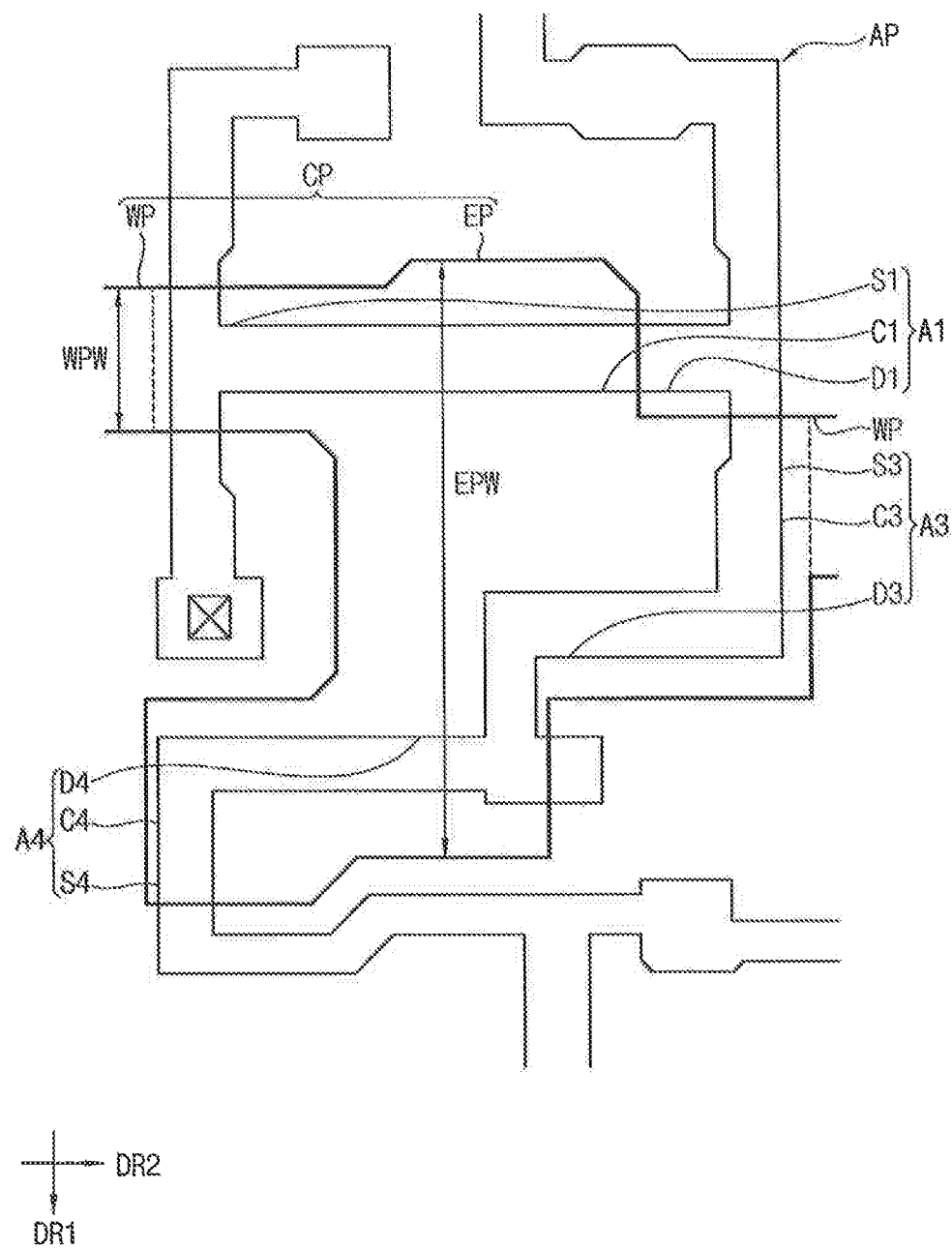
FIG. 15 is a layout view illustrating a conductive pattern and an active pattern of the pixel in FIG. 14, according to an exemplary embodiment of the present inventive concept.
Figure 16:
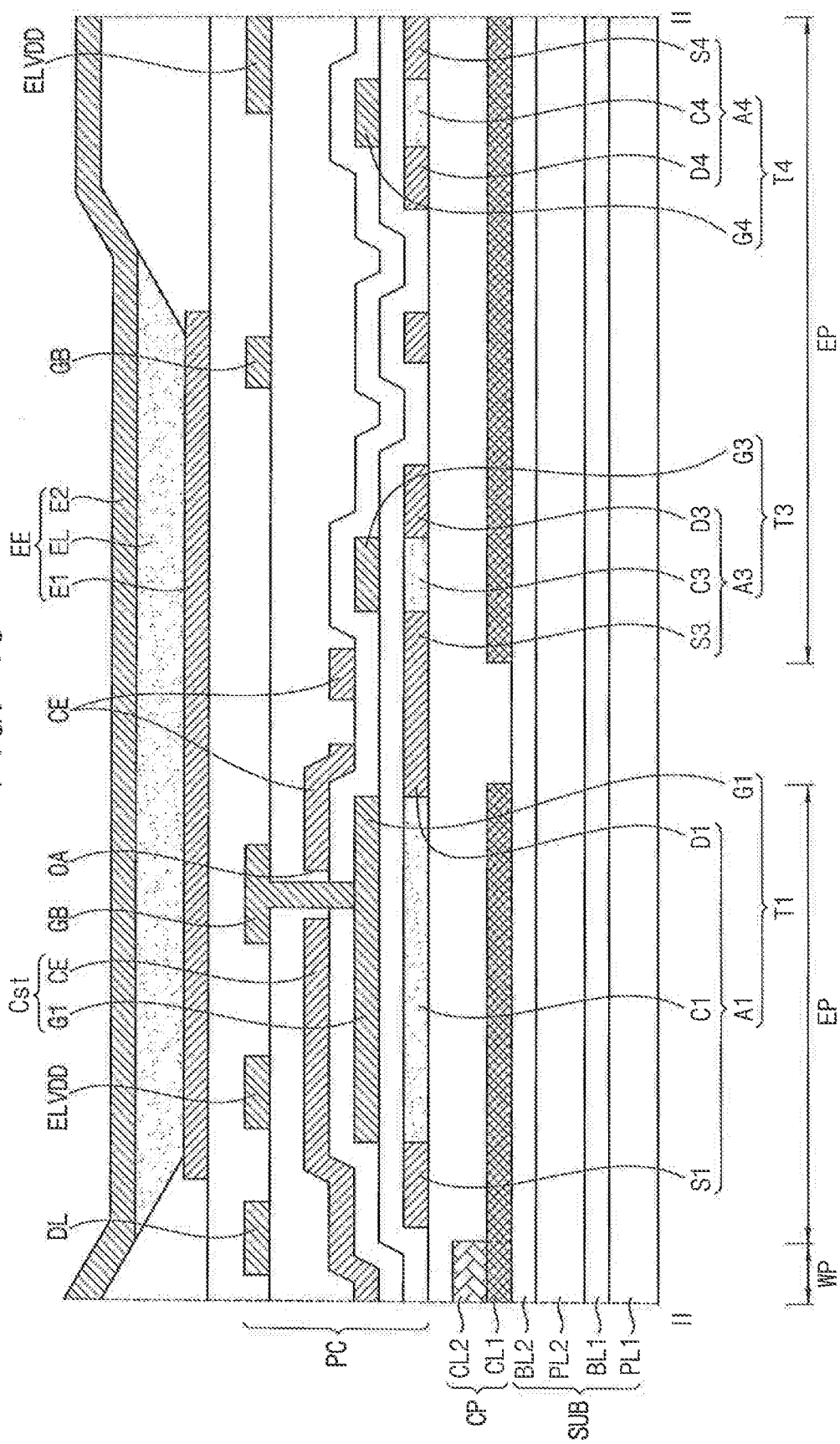
FIG. 16 is a cross-sectional view illustrating the display device in FIG. 14 taken along a line II-II', according to an exemplary embodiment of the present inventive concept.

Referring to FIGS. 14, 15, and 16, a pixel of a display device according to the present embodiment may include a pixel circuit PC including a first thin film transistor T1, a second thin film transistor T2, a third thin film transistor T3, a fourth thin film transistor T4, a fifth thin film transistor T5, a sixth thin film transistor T6, a seventh thin film transistor T7, a capacitor Cst, and a gate bridge GB selectively connected to a first scan line Sn, a second scan line Sn-1, a third scan line Sn-2, an emission control line EM, a data line DL, a driving voltage line ELVDD, and an initialization voltage line Vint. A light emitting element EE is connected to the pixel circuit PC. A conductive pattern CP may traverse the pixel circuit PC, and may include an electrode portion EP and a wiring portion WP. The electrode portion EP of the conductive pattern CP may overlap a first active pattern A1 of the first thin film transistor T1, a third active pattern A3 of the third thin film transistor T3, and a fourth active pattern A4 of the fourth thin film transistor T4. The wiring portion WP of the conductive pattern CP may be located outside the pixel circuit PC, and may be connected to the electrode portion EP to a supply voltage thereto.

In the display device according to the present embodiment different from the above-described display device of FIGS. 1-12, the conductive pattern CP may be located between the fourth active pattern A4 and the substrate SUB. The fourth channel C4 of the fourth active pattern A4 may overlap the electrode portion EP of the conductive pattern CP, and a voltage may be supplied to the electrode portion EP such that charges such as electrons or holes may be stored at the fourth channel C4 of the fourth active pattern A4. The charges stored at the fourth channel C4 may depend on a polarity of the voltage supplied to the electrode portion EP, thereby controlling a threshold voltage of the fourth thin film transistor T4. In other words, the threshold voltage of the fourth thin film transistor T4 may be increased or decreased by use of the electrode portion EP of the conductive portion CP, and hysteresis that can occur at the fourth thin film transistor T4 may be improved by controlling the threshold voltage of the fourth thin film transistor T4.

The conductive pattern CP may be located between the first active pattern A1 of the first thin film transistor T1 and the substrate SUB, between the third active pattern A3 of the third thin film transistor T3 and the substrate SUB, and between the fourth active pattern A4 of the fourth thin film transistor T4 and the substrate SUB. The electrode portion EP of the conductive pattern CP may overlap the first channel C1 of the first active pattern A1, the third channel C3 of the third active pattern A3, and the fourth channel C4 of the fourth active pattern A4. The wiring portion WP of the conductive pattern CP may be connected to the electrode portion EP to supply a voltage thereto.

The electrode portion EP of the conductive pattern CP to which a voltage is supplied may overlap the first active pattern. A1 of the first thin film transistor T1, the third active pattern A3 of the third thin film transistor T3, and the fourth active pattern A4 of the fourth thin film transistor T4. In this case, the display device according to the present embodiment may control threshold voltages of the first, third, and fourth thin film transistors T1, T3, and T4, thereby improving transistor characteristics of the first, third, and fourth thin film transistors T1, T3, and T4. Therefore, the light emission efficiency of the light emitting element EE electrically connected to the first thin film transistor T1 may be improved.

For example, the first thin film transistor T1 may be a driving thin film transistor connected to the light emitting element EE, the third thin film transistor T3 may be a complementary thin film transistor for connecting between the first drain electrode D1 and the first gate electrode G1 of the first thin film transistor T1, and the fourth thin film transistor T4 may be an initializing thin film transistor for supplying an initialization voltage to the first gate electrode G1 of the first thin film transistor T1. The first, third, and fourth thin film transistors T1, T3, and T4 may be thin film transistors that impart an actual influence to a current supplied to the light emitting element EE. The first channel C1, the third channel C3, and the fourth channel C4 of the first, third and fourth thin film transistors T1, T3 and T4 may overlap the electrode portion EP of the conductive pattern CP, a voltage may be supplied to the electrode portion EP of the conductive pattern CP, and charges such as electrons or holes may be resultantly supplied to the first channel C1, the third channel C3, and the fourth channel C4. The charges may be supplied to the first channel C1, the third channel C3 and the fourth channel C4 according to the polarity of the voltage supplied to the electrode portion EP of the conductive pattern CP, thereby controlling the threshold voltages of the first, third, and fourth thin film transistors T1, T3, and T4.

In other words, the threshold voltages of the first, third, and fourth thin film transistors T1, T3, and T4 may be increased or decreased by using the electrode portion EP of the conductive pattern CP, and the hysteresis that can occur at the first, third, and fourth thin film transistors T1, T3, and T4 may be improved by controlling the threshold voltages of the first, third, and fourth thin film transistors T1, T3, and T4. In this case, the light emission efficiency of the light emitting element EE electrically connected to the first thin film transistor T1 may be improved. The transistor characteristics of the first thin film transistor T1 that is a driving thin film transistor, the third thin film transistor T3 that is a complementary thin film transistor, and the fourth thin film transistor T4 that is an initializing thin film transistor may be improved by using the conductive pattern CP such that the display device with improved emission efficiency of the light emitting element EE may be provided.

Hereinafter, a display device according to another exemplary embodiment of the present inventive concept will be described with reference to FIGS. 17 to 19.

Hereinafter, elements of the display device according to the present embodiment, which are different from those of the display device previously described, will now be described.

Figure 17:
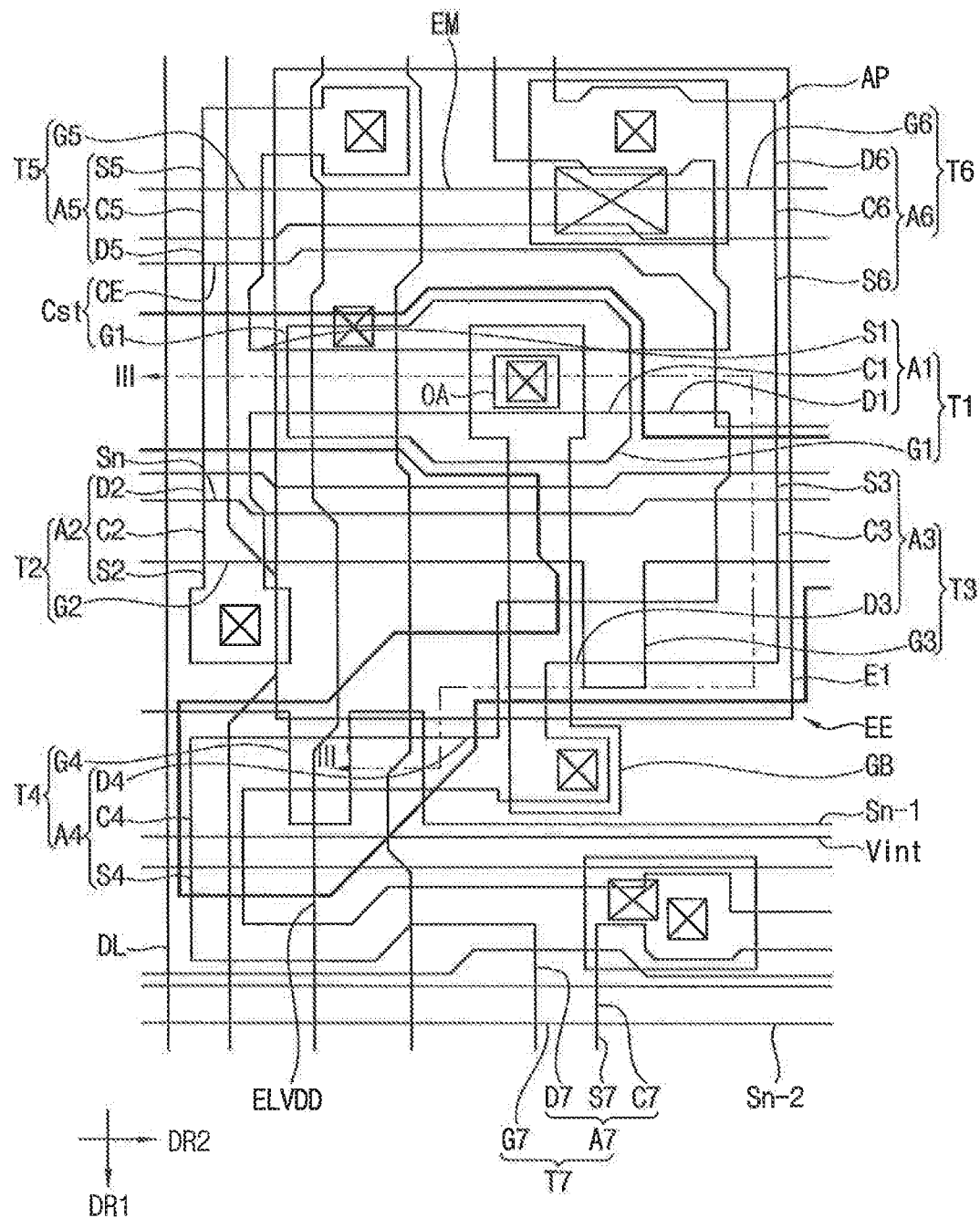
FIG. 17 is a layout view illustrating a pixel of a display device according to another exemplary embodiment of the present inventive concept.

FIG. 17 is a layout view illustrating a pixel of a display device according to another exemplary embodiment of the present inventive concept. FIG. 18 is a layout view illustrating a conductive pattern and an active pattern of the pixel in FIG. 17, according to an exemplary embodiment of the present inventive concept. FIG. 19 is a cross-sectional view illustrating the display device in FIG. 17 taken along a line III-III', according to an exemplary embodiment of the present inventive concept.

Figure 18:
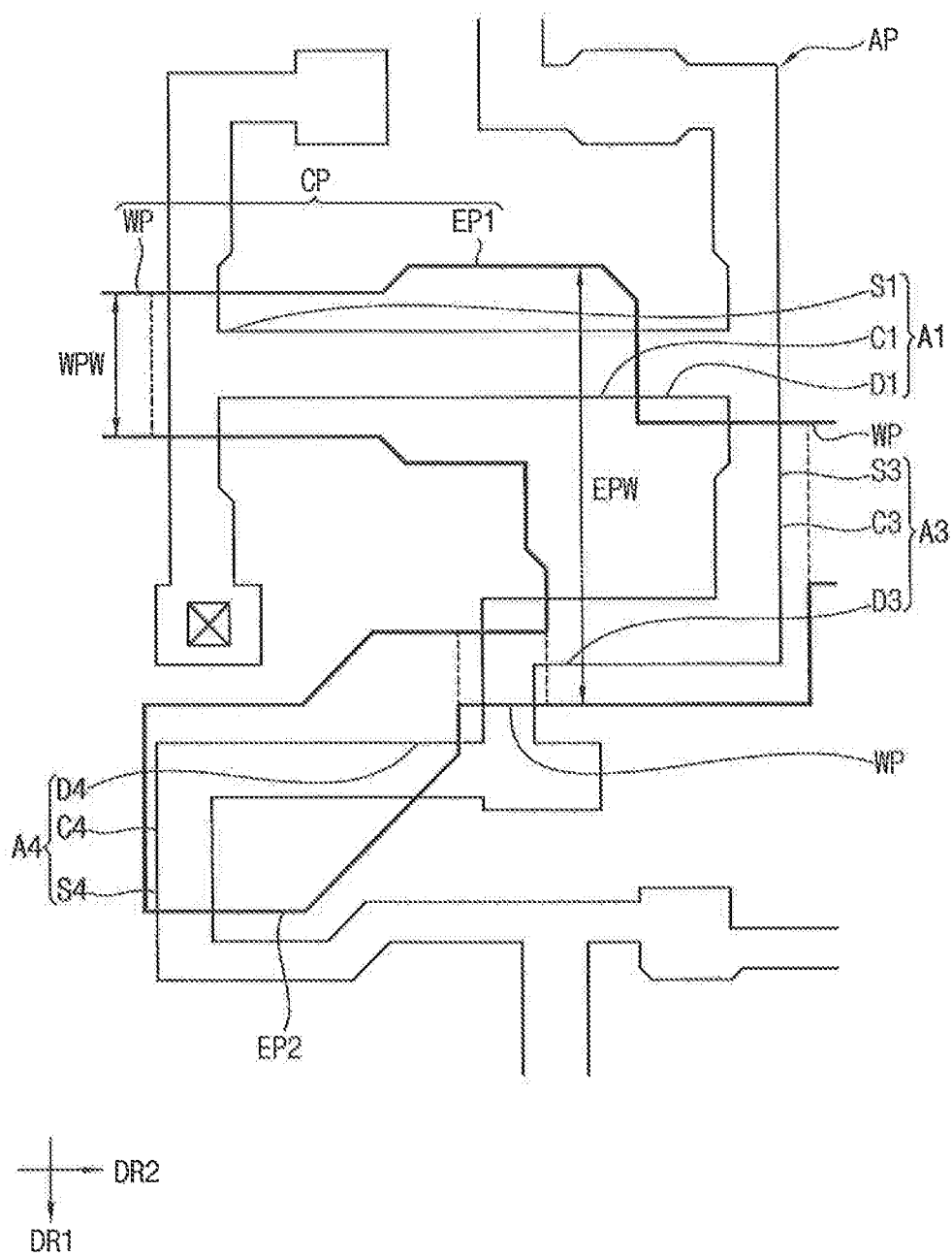
FIG. 18 is a layout view illustrating a conductive pattern and an active pattern of the pixel in FIG. 17, according to an exemplary embodiment of the present inventive concept.
Figure 19:
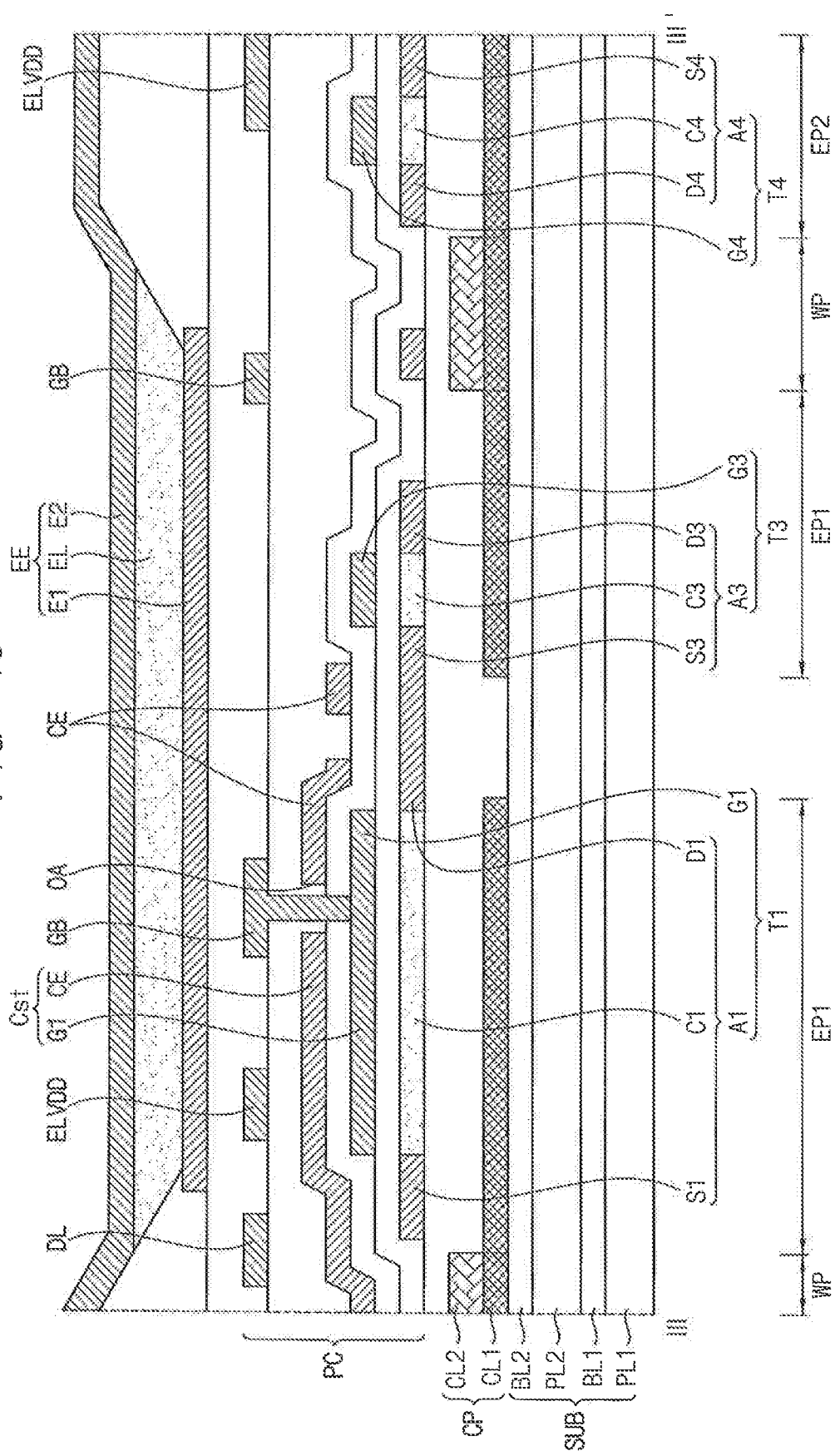
FIG. 19 is a cross-sectional view illustrating the display device in FIG. 17 taken along a line III-III', according to an exemplary embodiment of the present inventive concept.

Referring to FIGS. 17, 18, and 19, a pixel of a display device according to the present embodiment may include a pixel circuit PC and a light emitting element EE connected to the pixel circuit PC. The pixel circuit PC may include a plurality of thin film transistors T1, T2, T3, T4, T5, T6, and T7, a capacitor Cst, and a gate bridge GB. The thin film transistors T1, T2, T3, T4, T5, T6, and T7 may be selectively connected to a first scan line Sn, a second scan line Sn-1, a third scan line Sn-2, an emission control line EM, a data line DL a driving voltage line ELVDD and an initialization voltage line Vint. A conductive pattern CP may pass through the pixel circuit PC.

In the display device according to the present embodiment, the conductive pattern CP may include a first electrode portion EP1 and a second electrode portion EP2 which are spaced apart from each other, and a wiring portion WP connecting the first electrode portion EP1 and the second electrode portion EP2. The first electrode portion EP1 of the conductive pattern CP may overlap a first active pattern A1 of the first thin film transistor T1 and a third active pattern A3 of the third thin film transistor T3, and the second electrode portion EP2 of the conductive pattern CP may overlap a fourth active pattern A4 of the fourth thin film transistor T4. The wiring portion WP of the conductive pattern CP may be located outside the pixel circuit PC and connected to the first electrode portion EP1 to supply a voltage thereto. In addition, the wiring portion WP of the conductive pattern CP may be located between the first electrode portion EP1 and the second electrode portion EP2 and be connected thereto.

Hereinafter, a display device according to another exemplary embodiment of the present inventive concept will be described with reference to FIG. 20.

Figure 20:
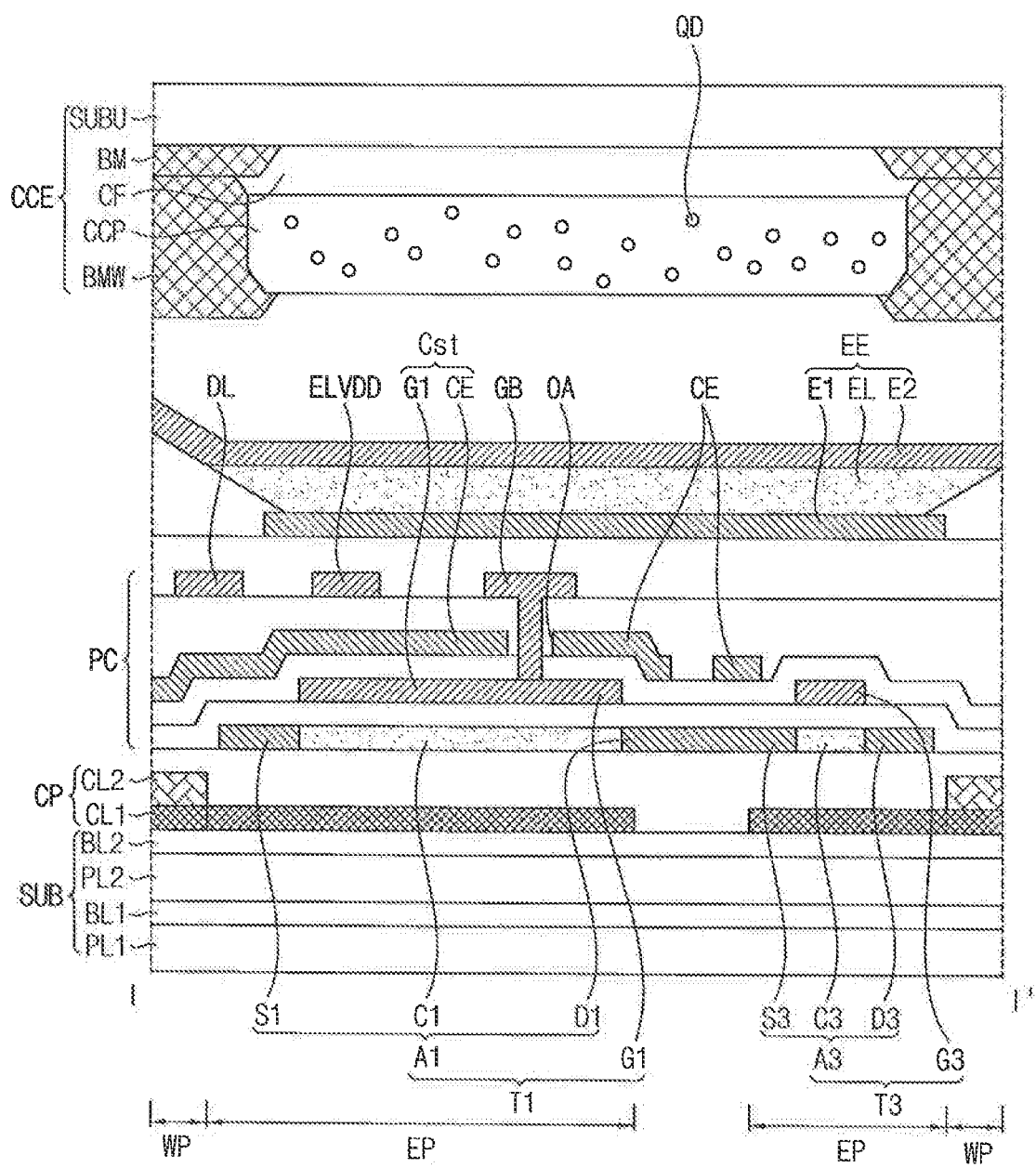
FIG. 20 is a cross-sectional view illustrating a display device according to another exemplary embodiment of the present inventive concept.

FIG. 20 is a cross-sectional view illustrating a display device according to another exemplary embodiment of the present inventive concept. For example, FIG. 20 may be a cross-sectional view illustrating the display device in FIG. 4 taken along a line I-I'.

Referring to FIGS. 4 and 20, a display device according to the present embodiment may include a substrate SUB, a pixel circuit PC disposed on the substrate SUB, a conductive pattern CP disposed between the substrate SUB and the pixel circuit PC, a light emitting element EE disposed on and connected to the pixel circuit PC, and a color conversion element CCE disposed on the light emitting element EE. The pixel circuit PC may include a plurality of thin film transistors T1, T2, T3, T4, T5, T6, and T7, a capacitor Cst, and a gate bridge GB. The thin film transistors T1, T2, T3, T4, T5, T6, and T7 may be selectively connected to a first scan line Sn, a second scan line Sn-1, a third scan line Sn-2, an emission control EM, a data line DL, a driving voltage line ELVDD, and an initialization voltage line Vint.

The substrate SUB, the conductive pattern CP, the pixel circuit PC, and the light emitting element EE of the display device according to the present embodiment described with reference to FIG. 20 may be substantially the same as or similar to the substrate SUB, the conductive pattern CP, the pixel circuit PC, and the light emitting element EE of the display device according to an exemplary embodiment of the present inventive concept described with reference to FIG. 6A, respectively. Therefore, descriptions on repeated elements may be omitted.

The color conversion element may include an upper substrate SUBU, a color conversion pattern CCP, a color filter CF, a light shielding wall BMW, and a light shielding pattern BM. The color conversion element CCE may be disposed over the light emitting element EE to convert a color of light emitted from the light emitting element EE or transmit the light.

The light conversion pattern CCP may be disposed between the upper substrate SUBU and the light emitting element EE. The color conversion pattern CCP may convert a color of light emitted from the emission layer EL of the light emitting element EE, or may transmit the light In an exemplary embodiment of the present inventive concept, the emission layer EL of the light emitting element EE may emit light having a first color upward, and the light conversion pattern CCP may convert the light having the first color into light having a second color or light having a third color, or transmit the light having the first color. For example, the emission layer EL of the light emitting element EE may emit blue light upward, and the color conversion pattern CCP may convert the blue light into red light or green light, or transmit the blue light.

The color conversion pattern CCP may include a quantum dot QD and/or a scattering particle. For example, the color conversion pattern CCP may include both the quantum dot QD and the scattering particle when the color conversion pattern CCP converts light having the first color into light having the second color or light having the third color, and the color conversion pattern CCP may include only the scattering particle when the color conversion pattern CCP transmits the light having the first color.

The color filter CF may be disposed between the upper substrate SUBU and the color conversion pattern CCP. The color filter CF may be a wavelength-selective optical filter that transmits only predetermined wavelength bands of incident light by transmitting light having a certain wavelength band and blocking light having an other wavelength band. For example, the color filter CF may block light having the first color that is not converted by the color conversion pattern CCP.

The light shielding wall BMW may be disposed between the color conversion patterns CCP under the upper substrate SUB, and the light shielding pattern BM may be disposed between the upper substrate SUBU and the light shielding wall BMW. The light shielding wall BMW and the light shielding pattern BM may divide areas in which the color conversion patterns CCP are disposed, and may reduce color mixing between the color conversion patterns CCP. The light shielding wall BMW and the light shielding pattern BM may include a material that blocks a transmission of light, for example, an organic material including a color agent such as black pigment, black dye, or the like.

The display device according to exemplary embodiments of the present inventive concept may be applied to a display device included in a computer, a notebook, a mobile phone, a smartphone, a smart pad, a portable media player (PMP), a personal digital assistant (PDA), air MP3 player, or the like.

In the display device according to exemplary embodiments of the present inventive concept, the conductive pattern CP may include the electrode portion EP overlapping the active pattern AP of the transistor (e.g., T1, T3 or T4) and the wiring portion WP supplying a voltage to the electrode portion EP. In addition, the thickness of the wiring portion WP may be greater than the thickness of the electrode portion ER. Accordingly, the delay of the voltage supplied to the electrode portion EP from the wiring portion WP may be prevented.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A display device, comprising:
    a substrate;
    a light emitting element on the substrate;
    a pixel circuit between the substrate and the light emitting element, wherein the pixel circuit is electrically connected to the light emitting element, and includes a plurality of transistors; and
    a conductive pattern including an electrode portion and a wiring portion for supplying a voltage to the electrode portion, wherein the electrode portion overlaps an active pattern of at least one transistor among the plurality of transistors,
    wherein the conductive pattern is disposed between the substrate and the active pattern, and
    wherein a thickness of the wiring portion is greater than a thickness of the electrode portion.

2. The display device of claim 1, wherein:
    the thickness of the electrode portion is in a range from 500 angstrom (Å) to 1000 Å, and
    the thickness of the wiring portion is in a range from 2000 Å to 3000 Å.

3. The display device of claim 1, wherein the conductive pattern includes:
    a first conductive layer formed in the electrode portion and the wiring portion; and
    a second conductive layer on the first conductive layer and formed in the wiring portion.

4. The display device of claim 3, wherein:
    a thickness of the first conductive layer is in a range from 500 angstrom (A) to 1000 Å, and
    a thickness of the second conductive layer is in a range from 1500 Å to 2000 Å.

5. The display device of claim 1, wherein a width of the wiring portion is less than a width of the electrode portion.

6. The display device of claim 1, wherein:
    the plurality of transistors include a first transistor including a first active pattern on the substrate and a first gate electrode on the first active pattern, the first active pattern including a first channel, and
    the electrode portion overlaps the first channel.

7. The display device of claim 6, wherein:
    the plurality of transistors further include:
    a second transistor including a second active pattern connected to the first active pattern and a second gate electrode on the second active pattern; and a third transistor including a third active pattern, and a third gate electrode on the third active pattern, the third active pattern including a third channel, wherein the third active pattern is connected to the first active pattern and the first gate electrode, and the electrode portion overlaps the third channel.

8. The display device of claim 7, wherein the electrode portion does not overlap the second active pattern.

9. The display device of claim 7, wherein:
the plurality of transistors further include a fourth transistor including a fourth active pattern, and a fourth gate electrode on the fourth active pattern, the fourth active pattern including a fourth channel,
wherein the fourth active pattern is connected to the first gate electrode and the third active pattern, and
the electrode portion overlaps the fourth channel.

10. The display device of claim 1, wherein:
the electrode portion includes:
a first electrode portion overlapping the active pattern of the at least one transistor among the plurality of transistors; and
a second electrode portion spaced apart from the first electrode portion and overlapping an active pattern of another transistor among the plurality of transistors, and
the wiring portion connects the second electrode portion to the first electrode portion.

11. The display device of claim 1, wherein:
the light emitting element includes a first electrode, an emission layer disposed on the first electrode, and a second electrode disposed on the emission layer, and
the emission layer includes at least one of an organic light emitting material or a quantum dot material.

12. The display device of claim 1, further comprising:
a color conversion element disposed on the light emitting element.

13. A display device, comprising:
a substrate;
a plurality of light emitting elements on the substrate;
a plurality of transistors between the substrate and the plurality of light emitting elements, and electrically connected to the plurality of light emitting elements; and
a conductive pattern including a plurality of electrode portions overlapping an active pattern included in each of the plurality of transistors and a plurality of wiring portions connecting the plurality of electrode portions,
wherein a thickness of each of the wiring portions is greater than a thickness of each of the electrode portions.

14. The display device of claim 13, wherein the conductive pattern has a grid shape in a plan view.

15. A display device, comprising:
a substrate;
a first light emitting element on the substrate;
a first pixel circuit between the substrate and the first light emitting element, wherein the first pixel circuit is electrically connected to the first light emitting element, and includes a first transistor and a second transistor; and
a conductive pattern including a first portion and a second portion disposed on the first portion, wherein the first portion overlaps a first active pattern of the first transistor and a second active pattern of the second transistor,
wherein the second portion does not overlap the first transistor and the second transistor, and
wherein a thickness of the second portion is greater than a thickness of the first portion.

16. The display device of claim 15, wherein the conductive pattern includes:
a first conductive layer overlapped with the first transistor and the second transistor, and
a second conductive layer disposed on the first conductive layer and not overlapped with the first transistor and the second transistor.

17. The display device of claim 16, wherein the second conductive layer is disposed in the second portion of the conductive pattern, and the first conductive layer is disposed in the first portion of the conductive pattern.

18. The display device of claim 15, further comprising:
a second light emitting element on the substrate; and
a second pixel circuit between the substrate and the second light emitting element, wherein the second portion of the conductive pattern is disposed between the first pixel circuit and the second pixel circuit in a plan view.

* * * * *